United States Patent
Hook et al.

(10) Patent No.: US 10,446,686 B2
(45) Date of Patent: Oct. 15, 2019

(54) ASYMMETRIC DUAL GATE FULLY DEPLETED TRANSISTOR

(71) Applicant: International Business Machines Corporation, Armonk, NY (US)

(72) Inventors: Terry Hook, Jericho, VT (US); Kangguo Cheng, Schenectady, NY (US); Yi Song, Albany, NY (US); Chen Zhang, Albany, NY (US); Xin Miao, Guilderland, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/916,519

(22) Filed: Mar. 9, 2018

(65) Prior Publication Data
US 2019/0280113 A1 Sep. 12, 2019

(51) Int. Cl.
| H01L 27/148 | (2006.01) |
| H01L 29/78 | (2006.01) |
| H01L 29/66 | (2006.01) |
| H01L 27/088 | (2006.01) |

(52) U.S. Cl.
CPC ........ *H01L 29/785* (2013.01); *H01L 27/0886* (2013.01); *H01L 29/66553* (2013.01); *H01L 29/66568* (2013.01); *H01L 29/66795* (2013.01)

(58) Field of Classification Search
USPC ........ 257/66, 72, E21.7, E29.003, E29.295, 257/E21.094, E21.104, E21.121, 257/E21.411–E21.416, E21.372, 223, 257/227, 291, 292, 439, 443, 250, 351, 257/E29.151, 392, 655, E27.1, E27.125, 257/E27.112, E29.117, E27.145, E29.147, 257/E29.182, E29.202, E29.273, E29.299, 257/E29.314, E29.32, E23.016
See application file for complete search history.

(56) References Cited

U.S. PATENT DOCUMENTS

| 6,610,576 B2 | 4/2003 | Nowak |
| 6,946,377 B2 | 9/2005 | Chambers |
| 7,091,566 B2 | 8/2006 | Zhu et al. |
| 7,348,641 B2 | 3/2008 | Zhu et al. |
| 8,389,392 B2 | 3/2013 | Sonsky et al. |
| 9,142,660 B2 | 9/2015 | Guo et al. |

(Continued)

OTHER PUBLICATIONS

Kedzierski, et al., "High-performance symmetric-gate and CMOS-compatible Vt asymmetric-gate FinFET devices," IEEE, 2001, 4 pages.

(Continued)

*Primary Examiner* — Niki H Nguyen
(74) *Attorney, Agent, or Firm* — Amin, Turocy & Watson LLP

(57) ABSTRACT

Techniques that facilitate an asymmetric dual gate fully depleted transistor are provided. In one example, a transistor device includes a semiconductor channel structure, a first gate structure and a second gate structure. The first gate structure comprises a first length. The second gate structure comprises a second length that is different than the first length. The first gate structure is disposed on a first surface of the semiconductor channel structure and the second gate structure is disposed on a second surface of the semiconductor channel structure.

17 Claims, 21 Drawing Sheets

(56) References Cited

U.S. PATENT DOCUMENTS

| | | | |
|---|---|---|---|
| 9,362,355 B1 | 6/2016 | Cheng et al. | |
| 9,530,866 B1 | 12/2016 | Zhang et al. | |
| 9,647,139 B2 | 5/2017 | Doris et al. | |
| 9,859,166 B1 | 1/2018 | Cheng et al. | |
| 2009/0261423 A1* | 10/2009 | Sawada | H01L 29/66795 257/392 |
| 2013/0221433 A1* | 8/2013 | Molin | H01L 21/823487 257/330 |
| 2013/0240951 A1* | 9/2013 | Bedell | H01L 29/66462 257/194 |
| 2014/0166981 A1* | 6/2014 | Doyle | H01L 29/66666 257/24 |
| 2015/0041921 A1* | 2/2015 | Choi | H01L 21/823431 257/401 |
| 2015/0137068 A1* | 5/2015 | Bartsch | H03H 9/02259 257/9 |
| 2016/0099211 A1* | 4/2016 | Baek | H01L 27/088 257/774 |
| 2017/0194210 A1* | 7/2017 | Oh | H01L 21/823456 |
| 2018/0033790 A1* | 2/2018 | Li | H01L 21/28556 |

OTHER PUBLICATIONS

Salvetat, et al., "Comparison Between Three $Si_{1-x}Ge_x$ versus Si Selective Etching Processes," ECS Transactions, 16 (10) 439-449 (2008) 10.1149/1.2986801 © The Electrochemical Society.

* cited by examiner

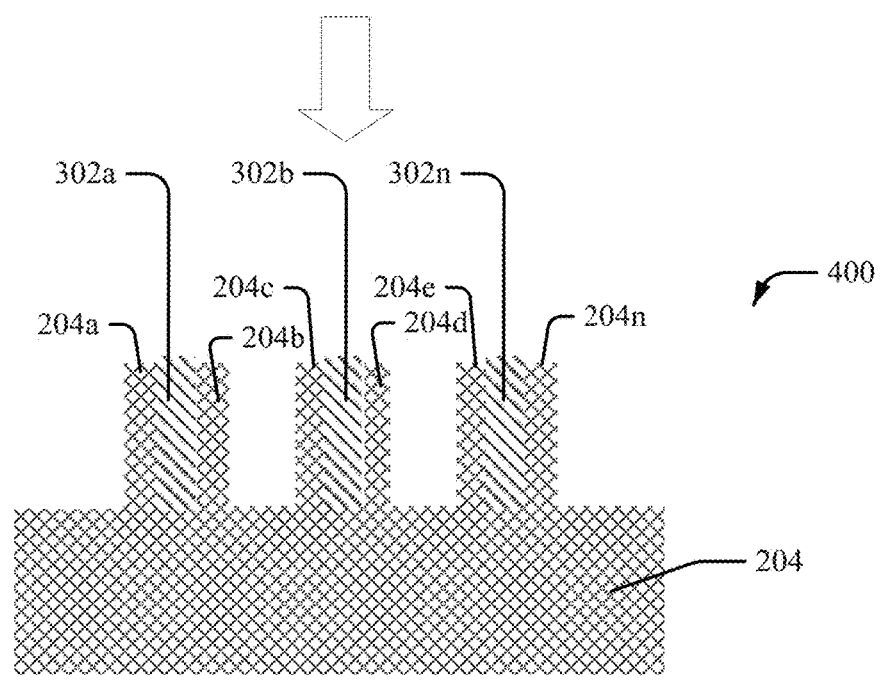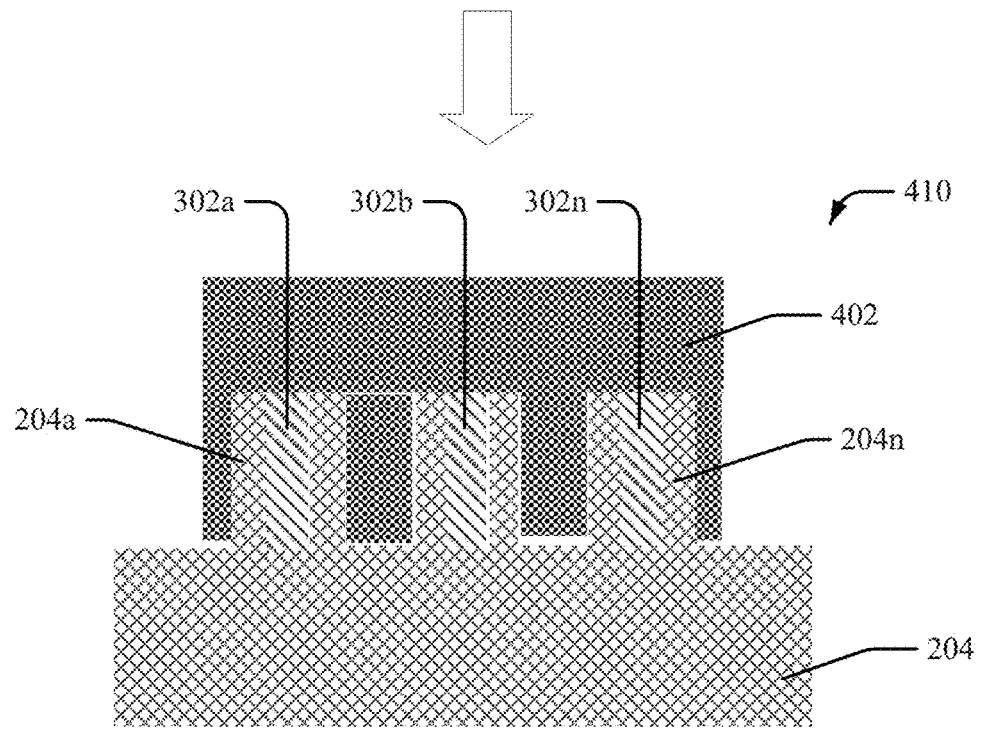
FIG. 4

ASYMMETRIC DUAL GATE FULLY DEPLETED TRANSISTOR

BACKGROUND

The subject disclosure relates to electronic device systems, and more specifically, to transistor structures.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, methods, apparatuses and/or devices that provide an asymmetric dual gate fully depleted transistor are described.

According to an embodiment, a transistor device can comprise a semiconductor channel structure, a first gate structure and a second gate structure. The first gate structure can comprise a first length. The second gate structure can comprise a second length that is different than the first length. The first gate structure can be disposed on a first surface of the semiconductor channel structure and the second gate structure can be disposed on a second surface of the semiconductor channel structure.

According to another embodiment, a method is provided. The method can comprise forming a fin semiconductor structure. The method can also comprise depositing a first dielectric material within a first recessed portion of the fin semiconductor structure. Additionally, the method can comprise depositing a second dielectric material within a second recessed portion of the fin semiconductor structure. A first size of the first recessed portion can be different than a second size of the second recessed portion.

According to yet another embodiment, a transistor device can comprise a semiconductor channel structure, a first gate structure and a second gate structure. The first gate structure can comprise a first length. The second gate structure can comprise a second length that is different than the first length. The second gate structure can modulate a threshold voltage for the transistor device and the first gate structure can control a state and an operation of the transistor device.

DESCRIPTION OF THE DRAWINGS

FIG. 4 also illustrates example, non-limiting intermediate FET structures in accordance with one or more embodiments described herein.

DETAILED DESCRIPTION

Figure 1:
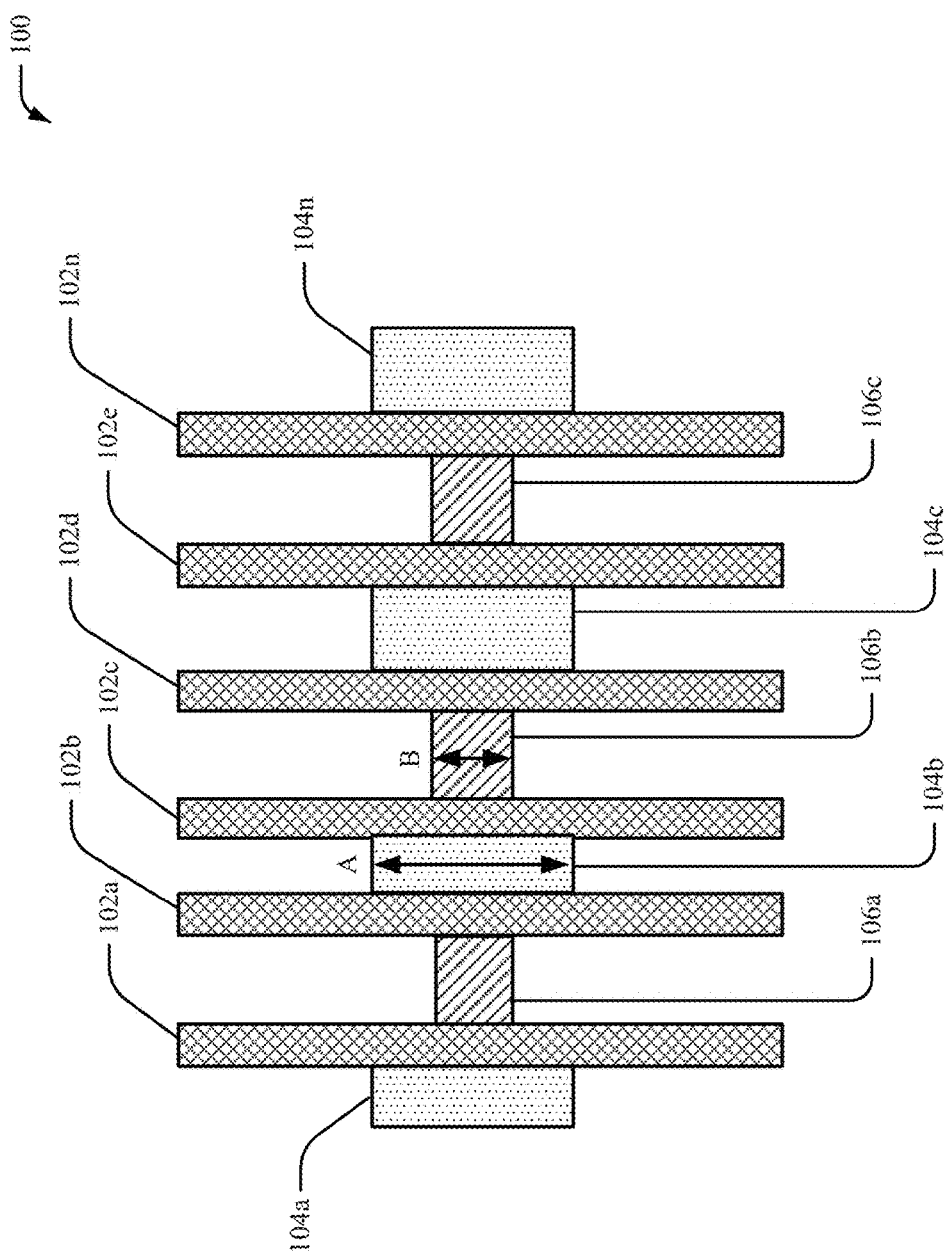
FIG. 1 illustrates an example, non-limiting field-effect transistor (FET) in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

A field-effect transistor (FET) is a transistor that employs an electric field to control functionality of the transistor. A FET transistor generally includes a source terminal, a gate terminal and drain terminal. A transistor structure for a FET with a back bias generally includes a back gate that overlaps an entire portion of the transistor structure. For instance, transistor structure for a FET with a back bias generally includes a back gate that overlaps a source region of the transistor structure, a drain region of the transistor structure, and a channel region of the transistor structure. However, there is generally a large overlap between the back gate and the transistor structure that creates undesired parasitic capacitance. Therefore, there is a need for forming a FET with back bias capability and reduced parasitic capacitance.

Embodiments described herein include systems, methods, apparatuses and devices associated with an asymmetric dual gate fully depleted transistor. For example, a novel transistor structure (e.g., a novel transistor device) can be provided that includes asymmetric dual gates. In an embodiment, a transistor structure can be provided with two gates of dissimilar length. A first gate can be disposed on a first side side of a transistor body of the transistor structure. Furthermore, a second gate can be disposed on a second side of the transistor body of the transistor structure. The transistor body can be, for example, a silicon substrate. In one example, the transistor structure can be a fully depleted transistor structure. In another example, the transistor body can be a semiconductor channel structure (e.g., a silicon channel structure) with one or more fin semiconductor structures. In an embodiment, the transistor structure can be a FinFET. In another embodiment, the transistor structure can be a nanosheet FET (e.g., a lateral nanosheet FET). In yet another embodiment, the transistor structure can be a vertical transport FET. In certain embodiments, the vertical transport FET can include independent gate control. For instance, the first gate and the second gate of the vertical transport FET can be separately controlled. In an embodiment associated with a vertical FET, the first gate associated with a longer length can be employed to control a state and/or an operation of the transistor structure and the second gate associated with a shorter length can be employed to modulate a threshold voltage at a source of the transistor structure. In another embodiment associated with a FinFET and/or a nanosheet FET, the first gate associated with longer length can control electrostatics of the transistor structure and a second gate associated with a shorter length can control a state and/or an operation of the transistor structure (e.g., the second gate associated with a shorter length can control a transport level of the transistor structure). As such, performance of the transistor structure (e.g., the transistor device) can be improved. For example, capacitance (e.g., parasitic capacitance) of the transistor structure (e.g., the transistor device) can be reduced. Additionally or alternatively, bias capability of the transistor structure (e.g., the transistor device) can be improved. Additionally or alternatively, efficiency of the transistor structure (e.g., the transistor device), timing characteristics of the transistor structure (e.g., the transistor device), and/or power characteristics of the transistor structure (e.g., the transistor device) can be improved.

FIG. 1 illustrates a top view of an example, non-limiting FET 100 in accordance with one or more embodiments described herein. The FET 100 can be, for example, a FinFET. The FET 100 can include a set of semiconductor channels 102a-n. The set of semiconductor channels 102a-n can be semiconductor channels shaped similar to a fin. For example, the set of semiconductor channels 102a-n can be semiconductor fin channels formed of a semiconductor material. In one example, the set of semiconductor channels 102a-n can be a set of silicon channels. For instance, the set of semiconductor channels 102a-n can be silicon channels shaped similar to a fin. However, it is to be appreciated that the set of semiconductor channels 102a-n can be formed from a different semiconductor material such as, for example, silicon germanium, germanium, III-V materials, II-VI materials, or another type of semiconductor material. In certain embodiments, the set of semiconductor channels 102a-n can form a body of a transistor structure (e.g., a transistor device). Furthermore, the set of semiconductor channels 102a-n can be raised as compared to a set of first gates 104a-n and a set of second gates 106a-n. For example, the set of semiconductor channels 102a-n can extend vertically from a substrate of a transistor structure (e.g., a transistor device). In an embodiment, the set of semiconductor channels 102a-n can include a source region and/or a drain region for the FET 100. In another embodiment, the set of first gates 104a-n and/or a set of second gates 106a-n can be positioned around the set of semiconductor channels 102a-n to allow current to flow down one or more channels associated sidewalls of the set of semiconductor channels 102a-n. In an aspect, a length of the set of first gates 104a-n can be different than a length of the set of second gates 106a-n. For instance, the set of first gates 104a-n and the set of second gates 106a-n can be asymmetric dual gates for the set of semiconductor channels 102a-n. In an example, the semiconductor channel 102c can be between the first gate 104b and the second gate 106b. The first gate 104b can be formed with a length A and the second gate 106b can be formed with a length B. The length A of the first gate 104b can be different than a length B of the second gate 106b. For example, the length A of the first gate 104b can be longer than a length B of the second gate 106b. In an embodiment, the first gate 104b and the second gate 106b can include a corresponding electrical potential. For example, the first gate 104b and the second gate 106b can be connected. In another embodiment, the first gate 104b and the second gate 106b can include different electrical potentials. For example, the first gate 104b can control a first functionality of the FET 100 and the second gate 106b can control a second functionality of the FET 100. In one example, the first gate 104b can set an electrostatic characteristic of the FET 100 and the second gate 106b can set a transport characteristic of the FET 100.

Figure 2:
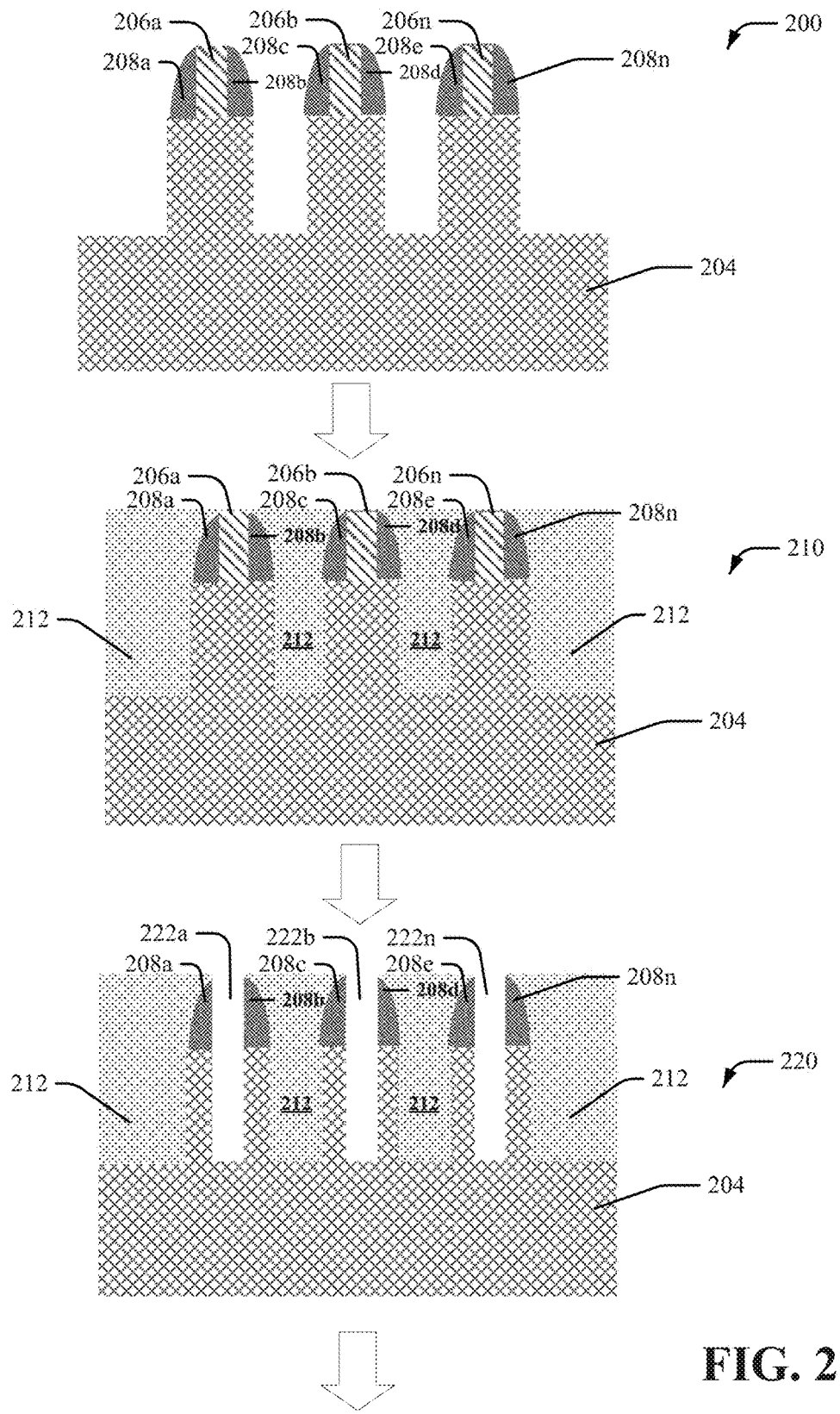
FIG. 2 illustrates example, non-limiting intermediate FET structures in accordance with one or more embodiments described herein.
Figure 3:
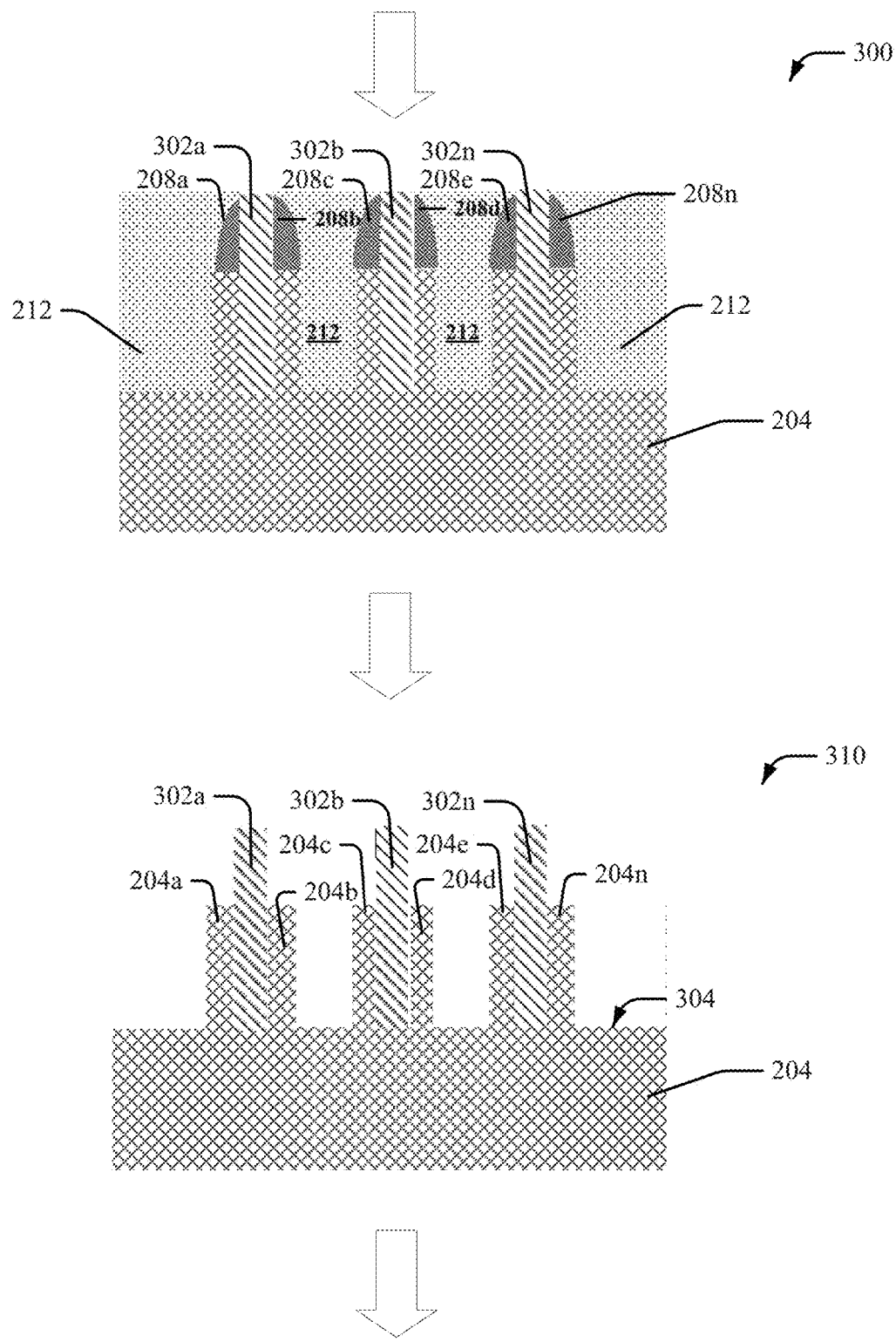
FIG. 3 also illustrates example, non-limiting intermediate FET structures in accordance with one or more embodiments described herein.

FIGS. 2-4 pictorially depict an example process for fabricating the FET 100. With reference to FIG. 2, presented is a cross-sectional view of an intermediate FET structure 200, an intermediate FET structure 210, and an intermediate FET structure 220 in accordance with one or more embodiments described herein. Repetitive description of like elements employed in other embodiments described herein is omitted for sake of brevity.

The intermediate FET structure 200 can include a substrate 204, a set of dielectric portions 206a-n, and a set of oxide mask portions 208a-n. The substrate 204 can be, for example, a silicon substrate layer. In another example, substrate 204 can be a bulk substrate. However, it is to be appreciated that the substrate 204 can be a different type of semiconductor substrate such as, for example, silicon germanium, germanium, III-V materials, II-VI materials, or another type of semiconductor material. The set of dielectric portions 206a-n can be, for example, oxide, nitride, oxynitride, carbon containing oxide/nitride, or another type of dielectric material. The set of mask portions 208a-n can be, for example, oxide, nitride, oxynitride, carbon containing oxide/nitride, or another type of dielectric material. The intermediate FET structure 210 can include the substrate 204, the set of dielectric portions 206a-n, the set of mask portions 208a-n, and a dielectric layer 212. The dielectric layer 212 can be, for example, oxide, nitride, oxynitride, carbon containing oxide/nitride, or another type of dielectric material. In an embodiment, the dielectric layer 212 can include a dielectric of a different etching rate (e.g., etching sensitivity) from the set of mask portions 208a-n. In an aspect, the dielectric layer 212 can be deposited on the substrate 204 and/or the set of mask portions 208a-n. The intermediate FET structure 220 can include the substrate 204, the set of dielectric portions 206a-n, the set of mask portions 208a-n, and the dielectric layer 212. In an aspect, a chemical mechanical planarization (CMP) process can be performed to form a set of openings 222a-n. For example, the CMP process can be performed to remove a portion of dielectric layer 212 above the set of dielectric portions 206a-n to facilitate formation of the set of openings 222a-n. Furthermore, the set of dielectric portions 206a-n and a portion of the substrate 204 can be etched to further facilitate formation of the set of openings 222a-n.

With reference to FIG. 3, presented is a cross-sectional view of an intermediate FET structure 300 and an intermediate FET structure 310 in accordance with one or more embodiments described herein. Repetitive description of like elements employed in other embodiments described herein is omitted for sake of brevity.

The intermediate FET structure 300 can include the substrate 204, the set of mask portions 208a-n, the dielectric layer 212, and a set of dielectric portions 302a-n. The set of dielectric portions 302a-n can be, for example, oxide, nitride, oxynitride, carbon containing oxide/nitride, or another type of dielectric material. Furthermore, the set of dielectric portions 302a-n can fill the set of openings 222a-n. For instance, the set of dielectric portions 302a-n can be deposited on the substrate 204 and can fill the set of openings 222a-n. In certain embodiments, a CMP process can be performed to facilitate form the intermediate FET structure 300. For example, a CMP process can be performed to remove a portion of the set of dielectric portions 302a-n to create a surface for the set of dielectric portions 302a-n that is even with a surface of the dielectric layer 212. The intermediate FET structure 310 can include the substrate 204 and the set of dielectric portions 302a-n. In an aspect, a wet etch process can be performed to form the intermediate FET structure 310. For instance, a wet etch process can be performed to remove the set of mask portions 208a-n and the dielectric layer 212. In an embodiment, the wet etch process can include a wet etch solution containing, for example, buffered hydrofluoric acid or hot phosphorous. In an aspect, the intermediate FET structure 310 can include a set of silicon channels 204a-n. The set of silicon channels 204a-n can be formed from a portion of the substrate 204. Furthermore, the set of silicon channels 204a-n can be silicon channels shaped similar to a fin. For example, the set of silicon channels 204a-n can be silicon fin channels. The set of silicon channels 204a-n can also be raised as compared to a surface 304 of the substrate 204. In an example, the set of silicon channels 204a-n can correspond to the set of semiconductor channels 102a-n shown in FIG. 1.

With reference to FIG. 4, presented is a cross-sectional view of an intermediate FET structure 400 and an intermediate FET structure 410 in accordance with one or more embodiments described herein. Repetitive description of like elements employed in other embodiments described herein is omitted for sake of brevity.

The intermediate FET structure 410 can include the substrate 204, the set of dielectric portions 302a-n, and an dummy gate 402. Furthermore, the substrate 204 can include the set of silicon channels 204a-n. The dummy gate 402 can be deposited on a surface of the substrate 204 (e.g., surfaces of the set of silicon channels 204a-n) and/or the set of dielectric portions 302a-n. The dummy gate 402 can be, for example, poly silicon, amorphous carbon or a dielectric material such as oxide, nitride, oxynitride, carbon containing oxide/nitride, or another type of dielectric material. In an embodiment, the dummy gate 402 can have a different etching rate (e.g., etching selectivity) from the set of dielectric portions 302a-n. In an embodiment, the dummy gate 402 can be deposited and/or patterned based on a recess etching process. In certain embodiments, the dummy gate 402 can be a spin-on polymer deposited via a spin on deposition process. In an example, the dummy gate 402 can correspond to the set of first gates 104a-n shown in FIG. 1 and the set of dielectric portions 302a-n can correspond to the set of second gates 106a-n shown in FIG. 1.

Figure 5:
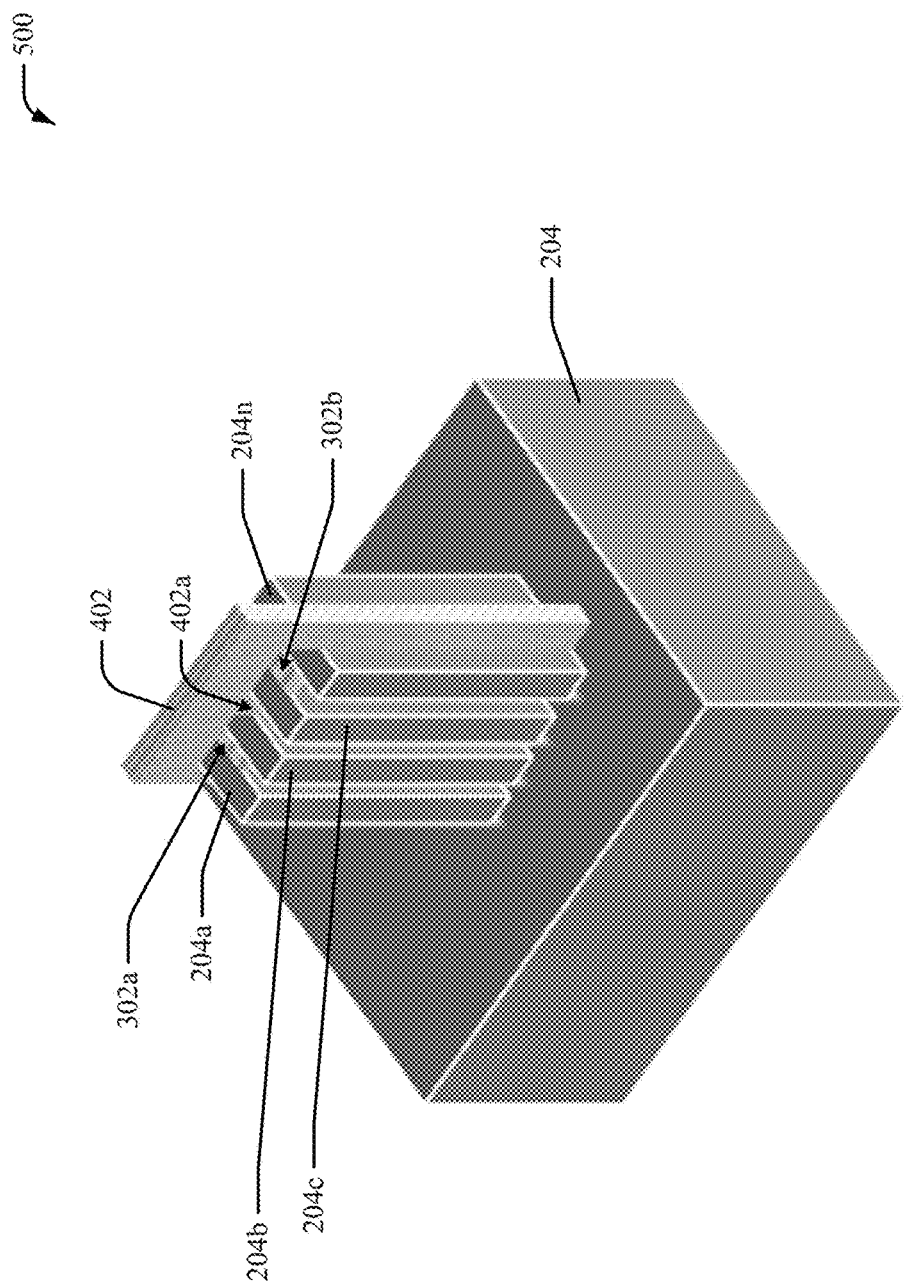
FIG. 5 illustrates a perspective view of an example, non-limiting FET structure in accordance with one or more embodiments described herein.

FIG. 5 illustrates a perspective view of an example, non-limiting FET structure 500 in accordance with one or more embodiments described herein. Repetitive description of like elements employed in other embodiments described herein is omitted for sake of brevity.

The FET structure 500 can include the substrate 204, the set of dielectric portions 302a-b, and the dummy gate 402. Furthermore, the substrate 204 can include the set of silicon channels 204a-n. In an example, the FET structure 500 can be a perspective view of at least a portion of the intermediate FET structure 410. In a non-limiting example as shown in FIG. 5, the oxide portion 302a can be located between the silicon channel 204a and the silicon channel 204b. In an aspect, a size (e.g., a length, a width) of the oxide portion 302a can be different than a size (e.g., a length, a width) of a portion 402a of the dummy gate 402. For example, a size (e.g., a length, a width) of the oxide portion 302a can be shorter than a size (e.g., a length, a width) of the portion 402a of the dummy gate 402. Additionally, the oxide portion 302b can be located between the silicon channel 204c and the silicon channel 204n. In an aspect, a size (e.g., a length, a width) of the oxide portion 302b can be different than a size (e.g., a length, a width) of a portion 402a of the dummy gate 402. For example, a size (e.g., a length, a width) of the oxide portion 302b can be shorter than a size (e.g., a length, a width) of the portion 402a of the dummy gate 402. In an embodiment, the oxide layer can be a spacer implemented as a hardmask to etch exposed oxide.

Figure 6:
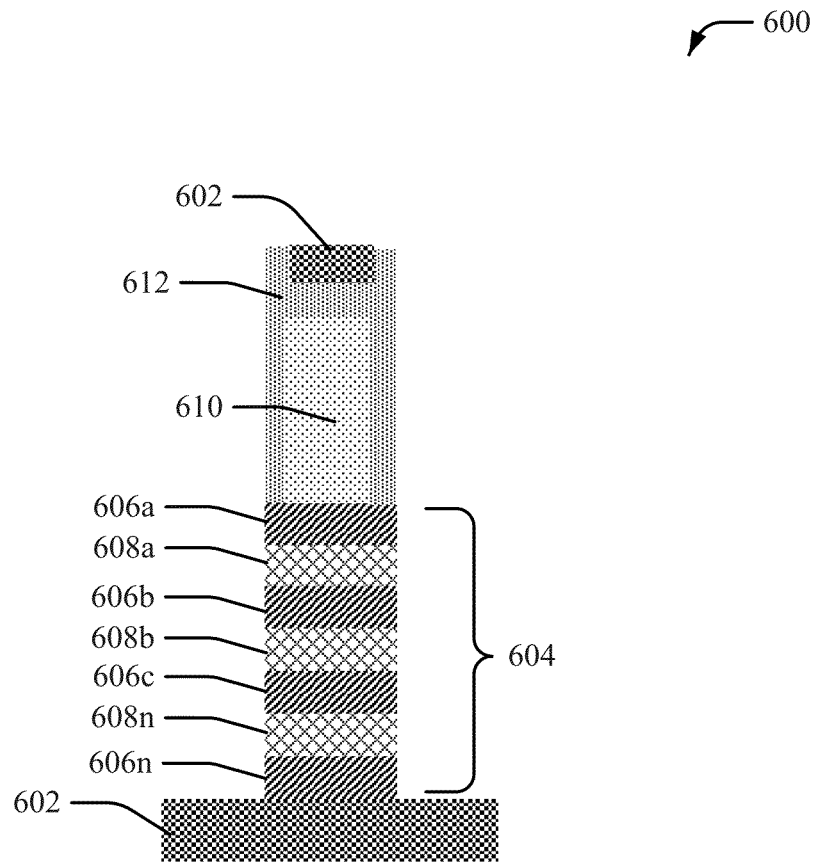
FIG. 6 illustrates a cross-sectional view of an example, non-limiting nanosheet FET structure in accordance with one or more embodiments described herein.

FIG. 6 illustrates a cross-sectional view of an example, non-limiting FET structure 600 in accordance with one or more embodiments described herein. Repetitive description of like elements employed in other embodiments described herein is omitted for sake of brevity.

The FET structure 600 can be, for example, a lateral nanosheet FET with a suspended nanosheet channel. The FET structure 600 can include a substrate 602, a nanosheet structure 604, a spacer layer 612 and a dummy gate 610. The nanosheet structure 604 can include a set of first semiconductor layers 606a-n and a set of second semiconductor layers 608a-n. In a non-limiting example, the set of first semiconductor layers 606a-n can be a set of first silicon channels and the set of second semiconductor layers 608a-n can be a set of second silicon channels. However, it is to be appreciated that the set of first semiconductor layers 606a-n and/or set of second semiconductor layers 608a-n can be a different type of semiconductor material. The spacer layer 612 can be, for example, a cladding spacer structure. In example, the spacer layer 612 can include oxide, nitride, oxynitride, carbon containing oxide/nitride, or another type of dielectric material. In an embodiment, the set of first semiconductor layers 606a-n can include silicon germanium. In one example, the set of first semiconductor layers 606a-n can be sacrificial layers. Furthermore, the set of second semiconductor layers 608a-n can include silicon. In certain embodiments, different layers of the set of first semiconductor layers 606a-n can include different germanium content. For example, the first semiconductor layer 606a can include a lower germanium content than the first semiconductor layer 606b.

Figure 7:
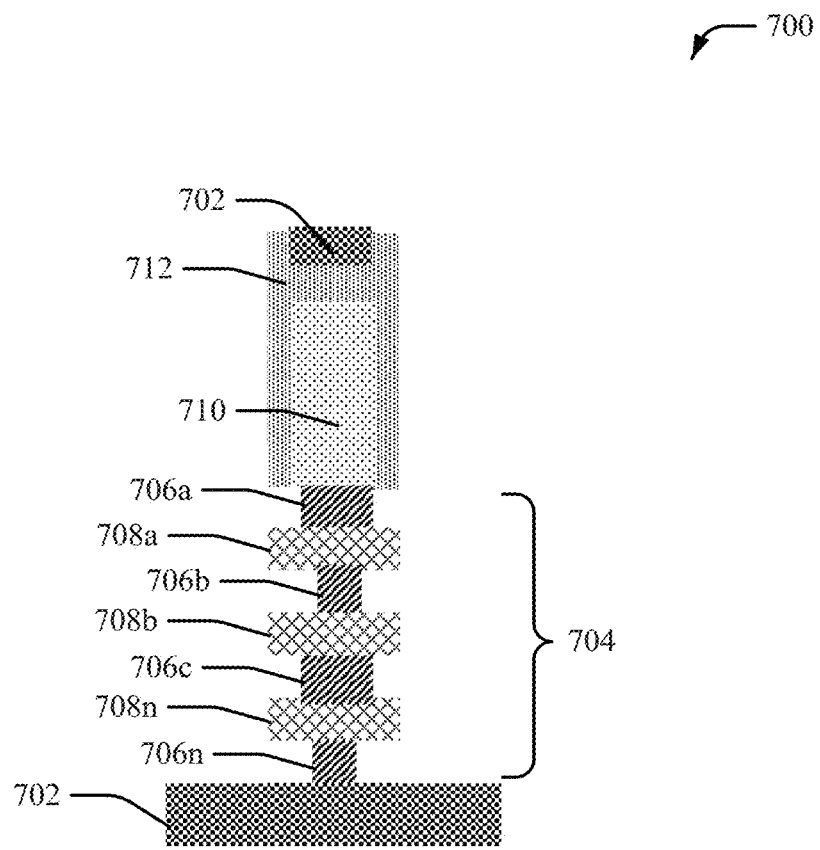
FIG. 7 illustrates a cross-sectional view of another example, non-limiting nanosheet FET structure in accordance with one or more embodiments described herein.

FIG. 7 illustrates a cross-sectional view of an example, non-limiting FET structure 700 in accordance with one or more embodiments described herein. Repetitive description of like elements employed in other embodiments described herein is omitted for sake of brevity.

The FET structure 700 can be, for example, a lateral nanosheet FET with a suspended nanosheet channel. The FET structure 700 can include a substrate 702, a nanosheet structure 704, a spacer layer 712 and a dummy gate 710. The nanosheet structure 704 can include a set of first semiconductor layers 706a-n and a set of second semiconductor layers 708a-n. In a non-limiting example, the set of first semiconductor layers 706a-n can be a set of first silicon channels and the set of second semiconductor layers 708a-n can be a set of second silicon channels. However, it is to be appreciated that the set of first semiconductor layers 706a-n and/or set of second semiconductor layers 708a-n can be a different type of semiconductor material. The spacer layer 712 can be, for example, a cladding spacer structure. In example, the spacer layer 712 can include oxide, nitride, oxynitride, carbon containing oxide/nitride, or another type of dielectric material. In an embodiment, the set of first semiconductor layers 706a-n can include silicon germanium. In one example, the set of first semiconductor layers 706a-n can be sacrificial layers. Furthermore, the set of second semiconductor layers 708a-n can include silicon. In certain embodiments, different layers of the set of first semiconductor layers 706a-n can include different germanium content. For example, the first semiconductor layer 706a can include a lower germanium content than the first semiconductor layer 706b. In an embodiment, at least a portion of the set of first semiconductor layers 706a-n can comprise different widths. For example, the first semiconductor layer 706a can be wider than the first semiconductor layer 706b. An exemplary processing to form such structure can include performing selectively etching of semiconductor layers 706a-n against semiconductor layers 708a-n. In an embodiment, semiconductor layers 706a-n that have higher germanium content can have higher etching rate than semiconductor layers 706a-n that have lower germanium content. Additionally or alternatively, at least a portion of the set of second semiconductor layers 708a-n can comprise different widths. For example, the second semiconductor layer 708b can be wider than the second semiconductor layer 708a.

Figure 8:
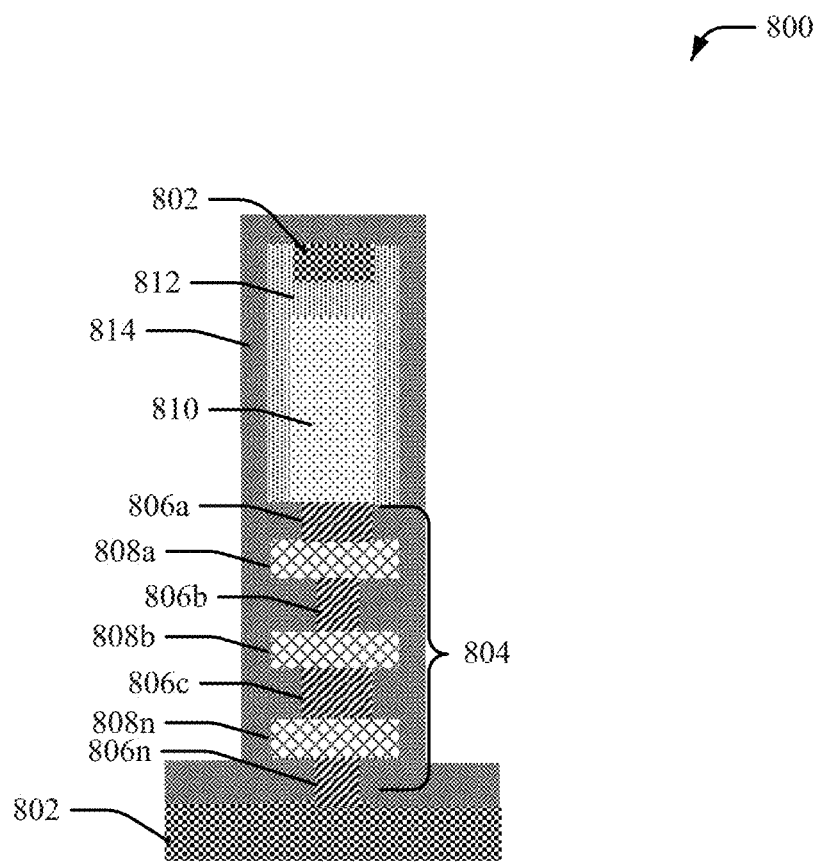
FIG. 8 illustrates a cross-sectional view of yet another example, non-limiting nanosheet FET structure in accordance with one or more embodiments described herein.

FIG. 8 illustrates a cross-sectional view of an example, non-limiting FET structure 800 in accordance with one or more embodiments described herein. Repetitive description of like elements employed in other embodiments described herein is omitted for sake of brevity.

The FET structure 800 can be, for example, a lateral nanosheet FET with a suspended nanosheet channel. The FET structure 800 can include a substrate 802, a nanosheet structure 804, a spacer layer 812, an inner spacer layer 814 and a dummy gate 810. The nanosheet structure 804 can include a set of first semiconductor layers 806a-n and a set of second semiconductor layers 808a-n. In a non-limiting example, the set of first semiconductor layers 806a-n can be a set of first silicon channels and the set of second semiconductor layers 808a-n can be a set of second silicon channels. However, it is to be appreciated that the set of first semiconductor layers 806a-n and/or set of second semiconductor layers 808a-n can be a different type of semiconductor material. The spacer layer 812 can be, for example, a cladding spacer structure. In example, the spacer layer 812 can include oxide, nitride, oxynitride, carbon containing oxide/nitride, or another type of dielectric material. The inner spacer layer 814 can include oxide, nitride, oxynitride, carbon containing oxide/nitride, or another type of dielectric material. In an embodiment, the set of first semiconductor layers 806a-n can include silicon germanium. In one example, the set of first semiconductor layers 806a-n can be sacrificial layers. Furthermore, the set of second semiconductor layers 808a-n can include silicon. In certain embodiments, different layers of the set of first semiconductor layers 806a-n can include different germanium content. For example, the first semiconductor layer 806a can include a lower germanium content than the first semiconductor layer 806b. In an embodiment, the inner spacer layer 814 can surround the nanosheet structure. For example, the set of first semiconductor layers 806a-n and the set of second semiconductor layers 808a-n can be surrounded by the inner spacer layer 814. An exemplary processing to form such structure includes performing isotropic deposition (e.g., atomic layer deposition) of the inner spacer layer 814 onto an existing structure as shown in FIG. 7.

Figure 9A:
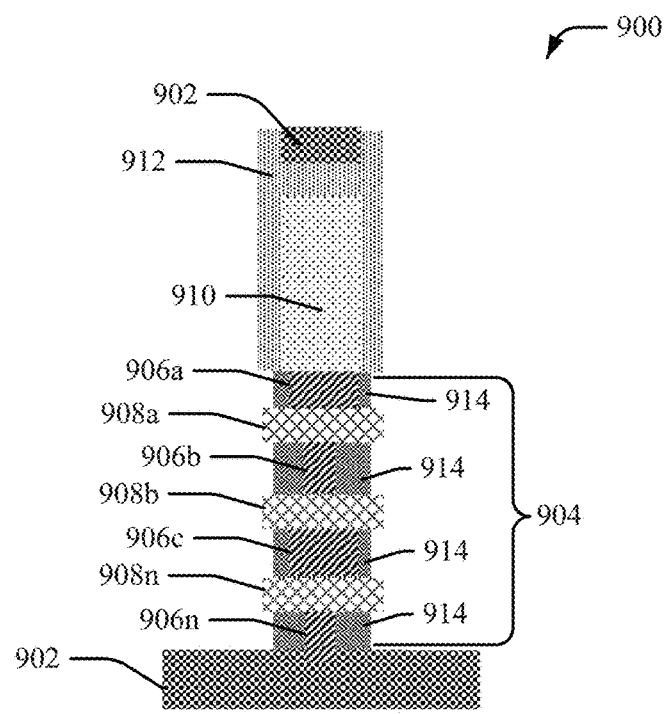
FIG. 9A illustrates a cross-sectional view of yet another example, non-limiting nanosheet FET structure in accordance with one or more embodiments described herein.

FIG. 9A illustrates a cross-sectional view of an example, non-limiting FET structure 900 in accordance with one or more embodiments described herein. Repetitive description of like elements employed in other embodiments described herein is omitted for sake of brevity.

The FET structure 900 can be, for example, a lateral nanosheet FET with a suspended nanosheet channel. The FET structure 900 can include a substrate 902, a nanosheet structure 904, a spacer layer 912, an inner spacer layer 914 and a dummy gate 910. The nanosheet structure 904 can include a set of first semiconductor layers 906a-n and a set of second semiconductor layers 908a-n. In a non-limiting example, the set of first semiconductor layers 906a-n can be a set of first silicon channels and the set of second semiconductor layers 908a-n can be a set of second silicon channels. However, it is to be appreciated that the set of first semiconductor layers 906a-n and/or set of second semiconductor layers 908a-n can be a different type of semiconductor material. The spacer layer 912 can be, for example, a cladding spacer structure. In example, the spacer layer 912 can include oxide, nitride, oxynitride, carbon containing oxide/nitride, or another type of dielectric material. The inner spacer layer 814 can include oxide, nitride, oxynitride, carbon containing oxide/nitride, or another type of dielectric material. In an embodiment, the set of first semiconductor layers 906a-n can include silicon germanium. In one example, the set of first semiconductor layers 906a-n can be sacrificial layers. Furthermore, the set of second semiconductor layers 908a-n can include silicon. In certain embodiments, different layers of the set of first semiconductor layers 906a-n can include different germanium content. For example, the first semiconductor layer 906a can include a lower germanium content than the first semiconductor layer 906b. In an embodiment, at least a portion of the set of first semiconductor layers 906a-n can comprise different widths. For example, the first semiconductor layer 906a can be wider than the first semiconductor layer 906b. Additionally or alternatively, the set of second semiconductor layers 908a-n can comprise corresponding widths. An exemplary processing to form such structure can include performing controlled isotropic etching (e.g., wet etching or dry etching) of the inner spacer layer 814 as shown in FIG. 8. Left over inner spacer layer 814 can become a discrete inner spacer layer 914 as shown in FIG. 9A.

Figure 9B:
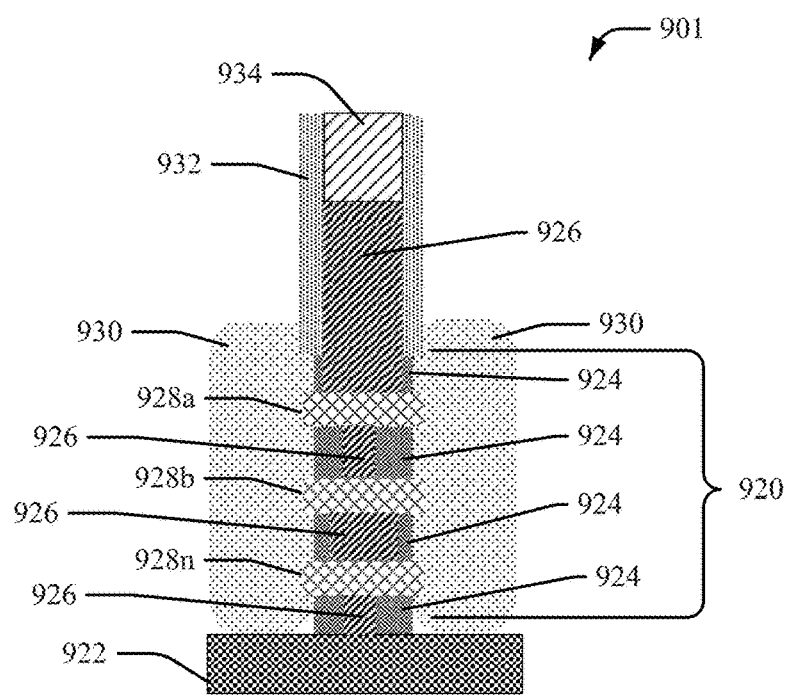
FIG. 9B illustrates a cross-sectional view of yet an example, non-limiting finalized nanosheet FET structure in accordance with one or more embodiments described herein.

FIG. 9B illustrates a cross-sectional view of an example, non-limiting finalized FET structure 901 in accordance with one or more embodiments described herein. Repetitive description of like elements employed in other embodiments described herein is omitted for sake of brevity.

The finalized FET structure 901 can be, for example, a lateral nanosheet FET with asymmetric gate length. The finalized FET structure 901 can include a substrate 922, a nanosheet structure 920, a spacer layer 932, an inner spacer layer 924 and a gate stack 926. The nanosheet structure 920 can include the gate stack 926 and a set of semiconductor layers 928a-n. In a non-limiting example, the set of semiconductor layers 928a-n can be a set of silicon channels. However, it is to be appreciated that the set of semiconductor layers 928a-n can be a different type of semiconductor material. The spacer layer 932 can be, for example, a cladding spacer structure. In example, the spacer layer 932 can include oxide, nitride, oxynitride, carbon containing oxide/nitride, or another type of dielectric material. The inner spacer layer 924 can include oxide, nitride, oxynitride, carbon containing oxide/nitride, or another type of dielectric material. In an embodiment, the gate stack 926 can be a high-k/metal gate stack. Furthermore, the gate stack 926 can include a first gate with a first gate length that is different than a second gate length of a second gate. The finalized FET structure 901 can also include epitaxy 930. The epitaxy 930 can be, for example, a source/drain epitaxy. The finalized FET structure 901 can also include a cap 934. The cap 934 can be, for example, a self-aligned contact cap.

Figure 10:
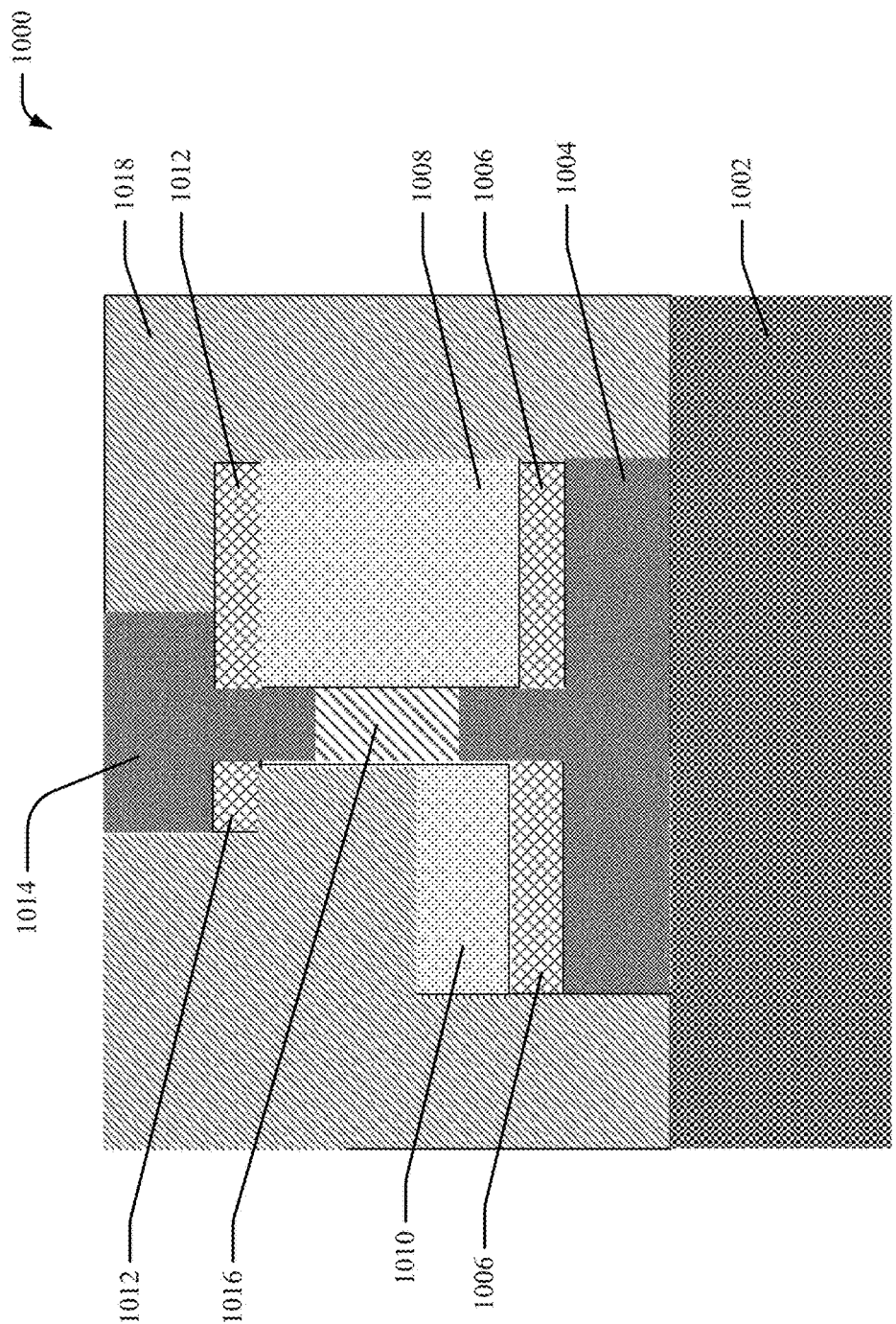
FIG. 10 illustrates a cross-sectional view of an example, non-limiting FET structure in accordance with one or more embodiments described herein.

FIG. 10 illustrates a cross-sectional view of an example, non-limiting FET structure 1000 in accordance with one or more embodiments described herein. Repetitive description of like elements employed in other embodiments described herein is omitted for sake of brevity.

The FET structure 1000 can include a source 1004 deposited on a substrate 1002. A bottom spacer 1006 and/or a channel 1016 can be deposited on the source 1004. A back gate 1010 can be deposited on the bottom spacer 1006. Furthermore, a front gate 1008 can be deposited on the bottom spacer 1006. In an embodiment, the channel 1016 can separate the back gate 1010 from the front gate 1008. A top spacer 1012 can be deposited on the front gate 1008. Furthermore, a drain 1014 can be deposited on the channel 1016 and/or the top spacer 1012. In an embodiment, a dielectric 1018 can also be deposited on the substrate 1002, the top spacer 1012 and/or the back gate 1010. For example, the dielectric 1018 can be an interlayer dielectric that is coated on the substrate 1002, the top spacer 1012 and/or the back gate 1010. In an aspect, the back gate 1010 can comprise a first length that is different than a second length of the front gate 1008. For example, the first length of the back gate 1010 can be smaller than (e.g., less than) the second length of the front gate 1008. Alternatively, the first length of the back gate 1010 can be larger than the second length of the front gate 1008. In a non-limiting example, a length of the back gate 1010 can be 5 nm and a length of the front gate 1008 can be 15 nm. In certain embodiments, the back gate 1010 can be aligned with the source 1004 of the FET structure 1000. The FET structure 1000 can be, for example, a vertical FET (VFET) with back bias capability and/or improved parasitic capacitance (e.g., reduced parasitic capacitance as compared to conventional transistor structures). In one example, the VFET can provide current flow perpendicular to the substrate 1002. The back gate 1010 of the FET structure 1000 can be placed on a bottom source side of the FET structure 1000. In an embodiment, the back gate 1010 can modulate a barrier height at a source/gate junction of the FET structure 1000 to, for example, module a threshold voltage of the FET structure 1000. In another embodiment, a bias for the back gate 1010 can be different than a bias for the front gate 1008. For example, the back gate 1010 and the front gate 1008 can be separated without being electrically connected. In one example, the back gate 1010 can be a first electrical contact that is different than the front gate 1008 that can be a second electrical contact. In an embodiment, the back gate 1010 can modulate a threshold voltage for the FET structure 1000 and the front gate 1008 can control a state and/or an operation of the FET structure 1000. In another embodiment, the back gate 1010 can control a state and/or an operation of the FET structure 1000 (e.g., the back gate 1010 can set a transport level for the FET structure 1000) and the front gate 1008 can control electrostatics the FET structure 1000. In an aspect, the back gate 1010 and the front gate 1008 with different lengths can provide improved performance for the FET structure 1000.

Figure 11:
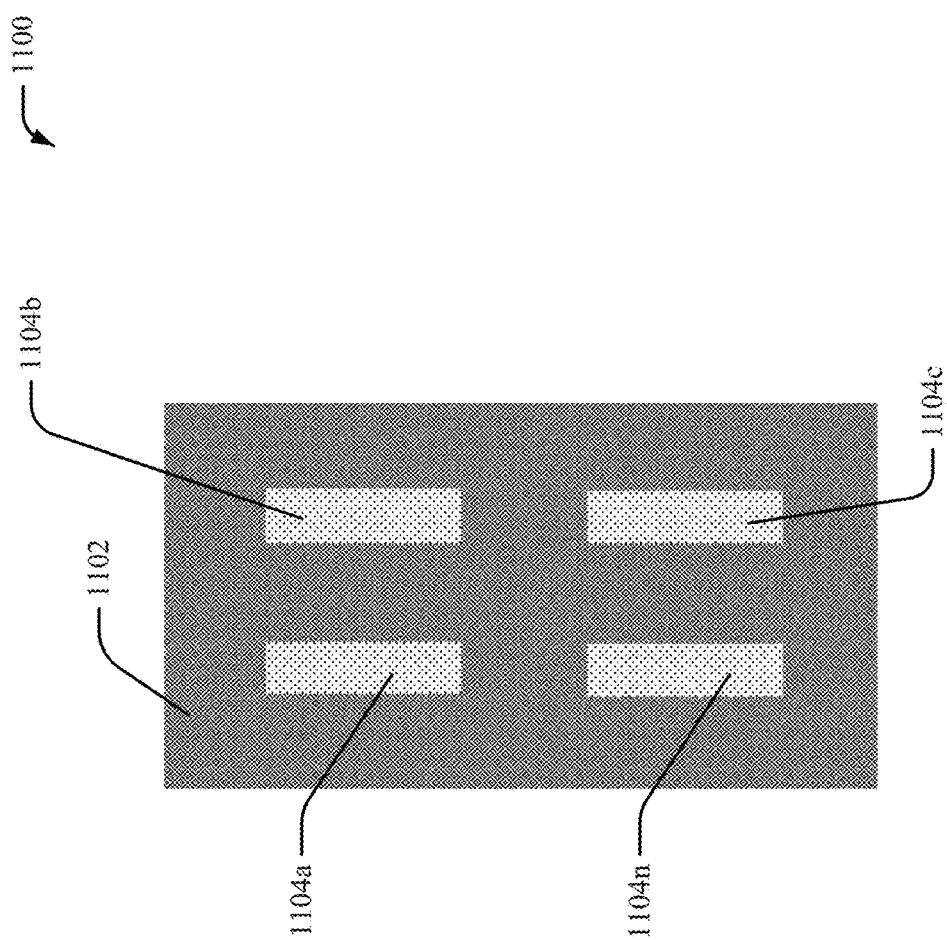
FIG. 11 illustrates a top view of an example, non-limiting FET structure in accordance with one or more embodiments described herein.

FIG. 11 illustrates a top view of an example, non-limiting FET structure 1100 in accordance with one or more embodiments described herein. Repetitive description of like elements employed in other embodiments described herein is omitted for sake of brevity.

The FET structure 1100 can include a dielectric layer 1102. The dielectric layer 1102 can be, for example, a nitride layer. In an embodiment, the dielectric layer 1102 can be deposited on a substrate such as, for example, a silicon substrate. A set of mandrel structures 1104a-n can be formed on the dielectric layer 1102. For instance, the set of mandrel structures 1104a-n can be, for example, a set of sacrificial supporting structures to facilitate formation of a fin pattern for a FinFET. In an aspect, a set of walls for the set of mandrel structures 1104a-n can be projected from the dielectric layer 1102. In an embodiment, the set of mandrel structures 1104a-n can be formed on the dielectric layer 1102 via an isotropic deposition process. In another aspect, the set of mandrel structures 1104a-n can be formed as a rectangular shape. Additionally, the set of mandrel structures 1104a-n can be surrounded by the dielectric layer 1102.

Figure 12:
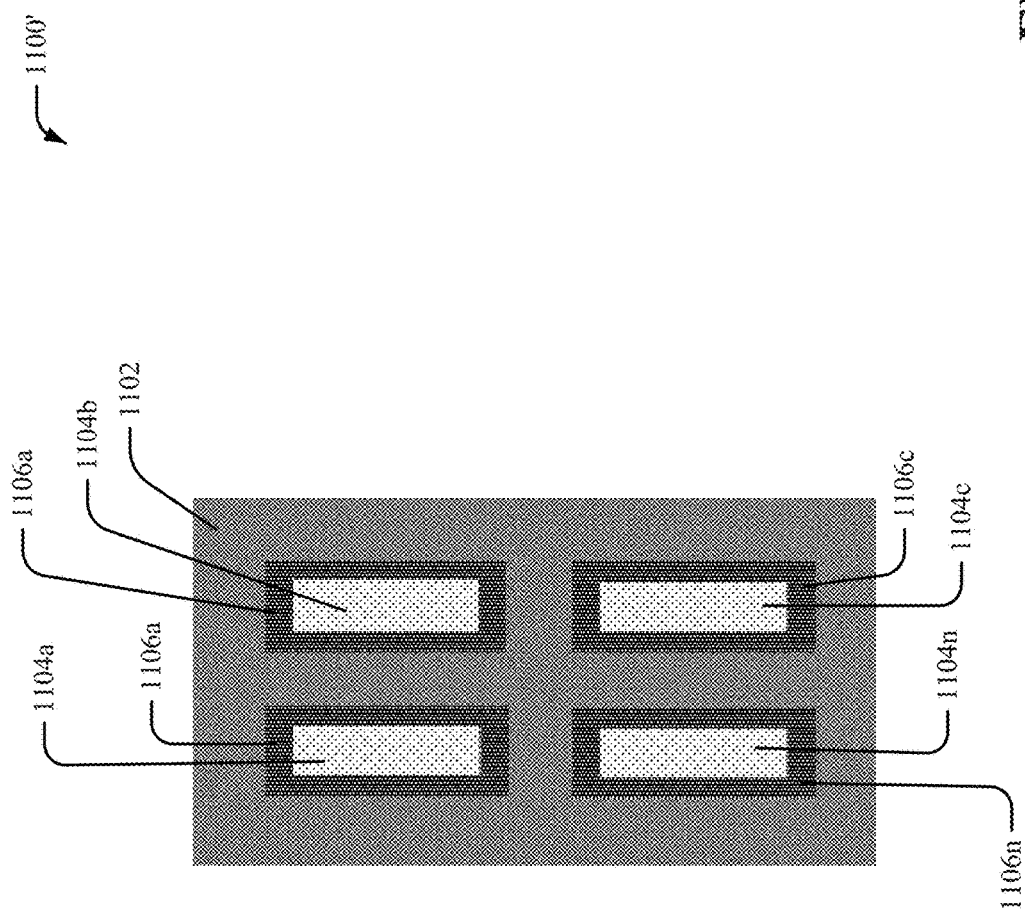
FIG. 12 illustrates a top view of another example, non-limiting FET structure in accordance with one or more embodiments described herein.

FIG. 12 illustrates a top view of an example, non-limiting FET structure 1100' in accordance with one or more embodiments described herein. Repetitive description of like elements employed in other embodiments described herein is omitted for sake of brevity.

The FET structure 1100' can be a different embodiment of the FET structure 1100 during a fabrication process. For example, the FET structure 1100 can be transformed into the FET structure 1100' during a fabrication process. The FET structure 1100' can include the dielectric layer 1102 and the set of mandrel structures 1104a-n. Furthermore, the FET structure 1100' can include a set of spacer structures 1106a-n. The set of spacer structures 1106a-n can surround the set of mandrel structures 1104a-n. In an embodiment, the set of spacer structures 1106a-n can include silicon nitride.

Figure 13:
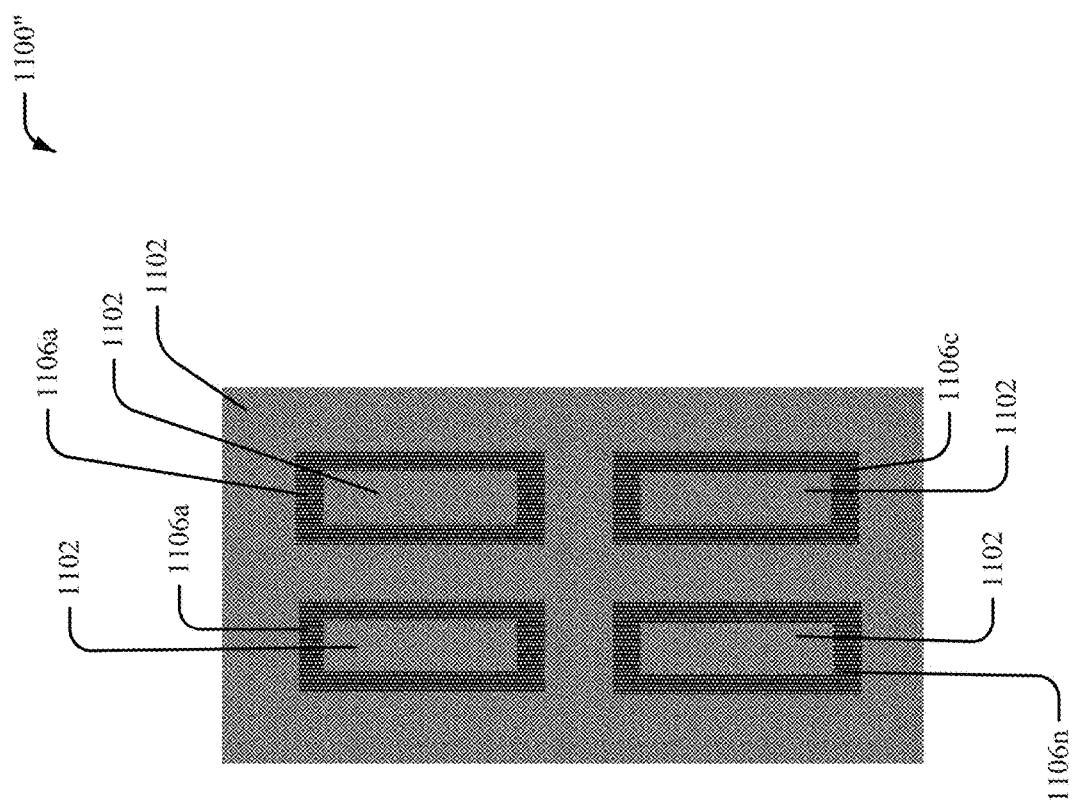
FIG. 13 illustrates a top view of yet another example, non-limiting FET structure in accordance with one or more embodiments described herein.

FIG. 13 illustrates a top view of an example, non-limiting FET structure 1100" in accordance with one or more embodiments described herein. Repetitive description of like elements employed in other embodiments described herein is omitted for sake of brevity.

The FET structure 1100" can be a different embodiment of the FET structure 1100' during a fabrication process. For example, the FET structure 1100' can be transformed into the FET structure 1100" during a fabrication process. The FET structure 1100" can include the dielectric layer 1102 and the set of spacer structures 1106*a-n*. For example, the set of mandrel structures 1104*a-n* can be removed during a spacer patterning process to facilitate a finalized pattern for the set of spacer structures 1106*a-n* on the dielectric layer 1102.

Figure 14:
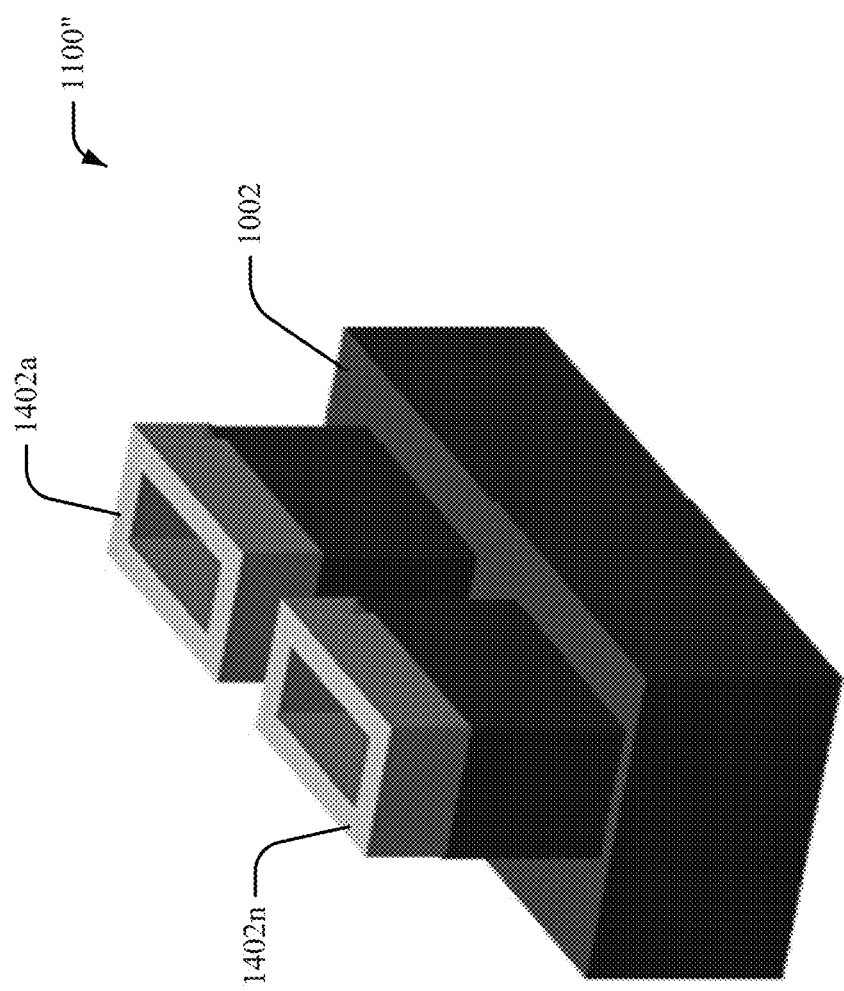
FIG. 14 illustrates a perspective view of an example, non-limiting FET structure in accordance with one or more embodiments described herein.

FIG. 14 illustrates a perspective view of the example, non-limiting FET structure 1100" in accordance with one or more embodiments described herein. Repetitive description of like elements employed in other embodiments described herein is omitted for sake of brevity.

The FET structure 1100" shown in FIG. 14 can include a dielectric structure 1402*a*, a dielectric structure 1404*n* and the substrate 1002 transformed by patterning and etching from the FET structure 1100" as shown in FIG. 13. As such, the substrate 1002 can be a patterned substrate. In one example, the dielectric structure 1402 can be a first spacer structure and the dielectric structure 1404*n* can be a second spacer structure. In an aspect, a set of walls for the dielectric structure 1402*a* and a set of side walls for the dielectric structure 1402*n* can be projected from the substrate 1002. The FET structure 1100" can be a vertical FET such as, for example, a vertical transport FET (VTFET). In an embodiment, the FET structure 1100" can be a VFET with a back-gate and fins patterned as a rectangular shape with a center cavity. In one example, the dielectric structure 1402*a* can be shaped as a first ring structure and the dielectric structure 1402*n* can be shaped as a second ring structure. Furthermore, the dielectric structure 1402*a* can be an independent structure from the dielectric structure 1402*n*.

Figure 15:
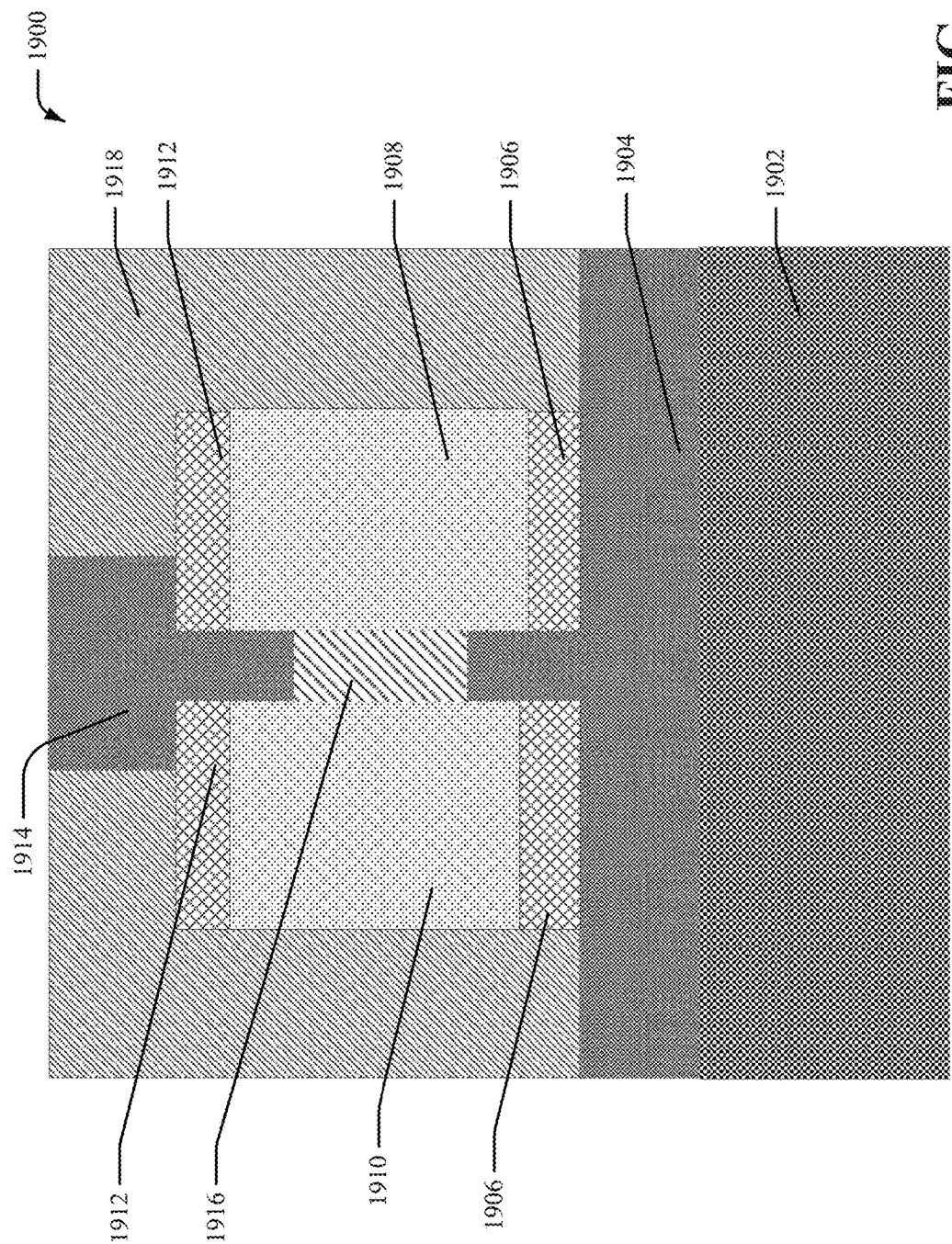
FIG. 15 illustrates a cross-sectional view of an example, non-limiting field-effect transistor (VFET) structure in accordance with one or more embodiments described herein.

FIGS. 15-18 pictorially depict an example process for fabricating a VFET. With reference to FIG. 15, presented is a cross-sectional view of an intermediate VFET structure 1900 in accordance with one or more embodiments described herein. Repetitive description of like elements employed in other embodiments described herein is omitted for sake of brevity.

The intermediate VFET structure 1900 can include a source 1904 deposited on a substrate 1902. A bottom spacer 1906 and/or a channel 1916 can be deposited on the source 1904. A back gate 1910 can be deposited on the bottom spacer 1906. Furthermore, a front gate 1908 can be deposited on the bottom spacer 1906. In an embodiment, the channel 1916 can separate the back gate 1910 from the front gate 1908. A top spacer 1912 can be deposited on the front gate 1908. Furthermore, a drain 1914 can be deposited on the channel 1916 and/or the top spacer 1912. In an embodiment, a dielectric 1918 can also be deposited on the substrate 1902, the top spacer 1912 and/or the back gate 1910. For example, the dielectric 1918 can be an interlayer dielectric that is coated on the substrate 1902, the top spacer 1912 and/or the back gate 1910. In an aspect, a length of the back gate 1910 of the intermediate VFET structure 1900 can correspond to a length of the front gate 1908. In an aspect, the source 1904 can be epitaxially grown. In another aspect, the source 1904 can be wider than the channel 1916.

Figure 16:
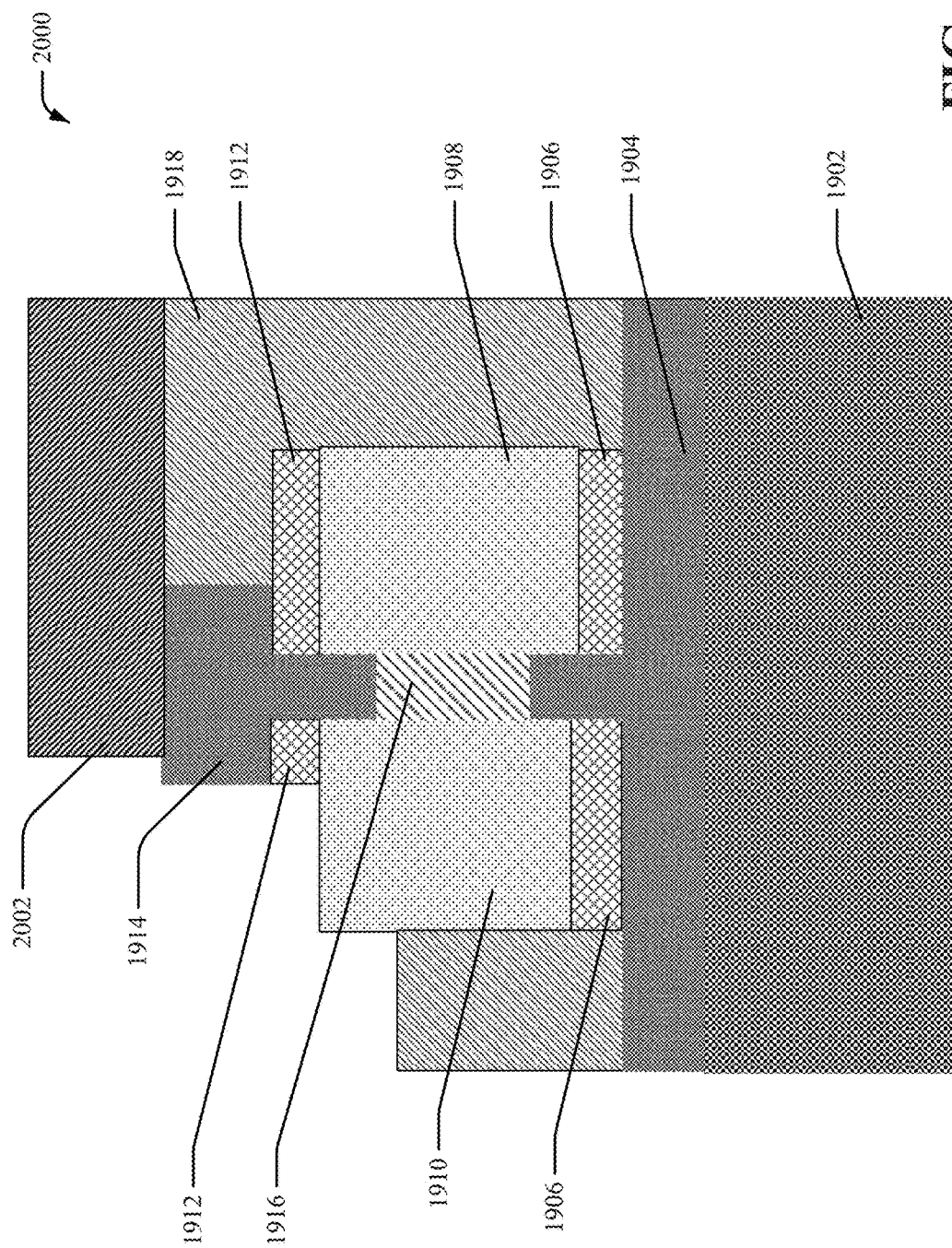
FIG. 16 illustrates a cross-sectional view of another example, non-limiting VFET structure in accordance with one or more embodiments described herein.

With reference to FIG. 16, presented is a cross-sectional view of an intermediate VFET structure 2000 in accordance with one or more embodiments described herein. Repetitive description of like elements employed in other embodiments described herein is omitted for sake of brevity.

The intermediate VFET structure 2000 can include the substrate 1902, the source 1904, the bottom spacer 1906, the front gate 1908, the back gate 1910, the top spacer 1912, the drain 1914, the channel 1916, the dielectric 1918 and a mask layer 2002. The mask layer 2002 can be deposited on the drain 1914 and the dielectric 1918. In an embodiment, the mask layer 2002 can be applied to cover a side of the front gate 1908. In certain embodiments, an overlay margin for the mask layer 2002 can be defined by a width of the source 1904. For instance, the overlay margin can be an amount of the mask layer 2002 that extends beyond the front gate 1908. As such, the mask layer 2002 can be employed to preserve a height (e.g., a length) of the front gate 1908. Additionally, in an embodiment, a portion of the dielectric 1918 can be removed to expose a portion of the top spacer 1912 and/or a portion of the back gate 1910.

Figure 17:
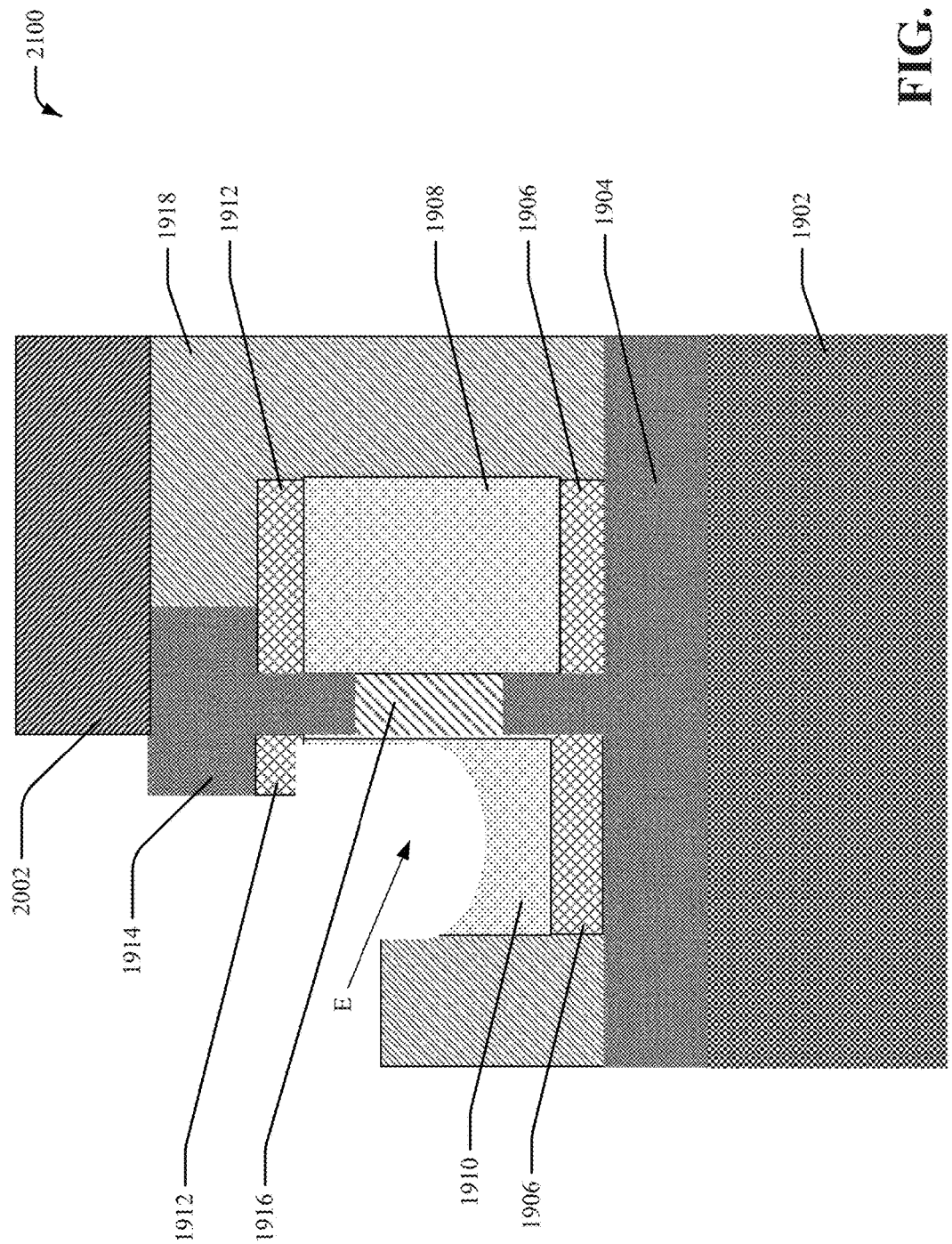
FIG. 17 illustrates a cross-sectional view of yet another example, non-limiting VFET structure in accordance with one or more embodiments described herein.

With reference to FIG. 17, presented is a cross-sectional view of an intermediate VFET structure 2100 in accordance with one or more embodiments described herein. Repetitive description of like elements employed in other embodiments described herein is omitted for sake of brevity.

The intermediate VFET structure 2100 can include the substrate 1902, the source 1904, the bottom spacer 1906, the front gate 1908, the back gate 1910, the top spacer 1912, the drain 1914, the channel 1916, the dielectric 1918 and the mask layer 2002. In an embodiment, a portion of the back gate 1910 can be removed from the back gate 1910. For example, a portion of the back gate 1910 that is exposed can be etched at a location E of the back gate 1910. In one example, a wet etching process can be performed to etch the location E of the back gate 1910. In another example, a dry etching process can be performed to etch the location E of the back gate 1910.

Figure 18:
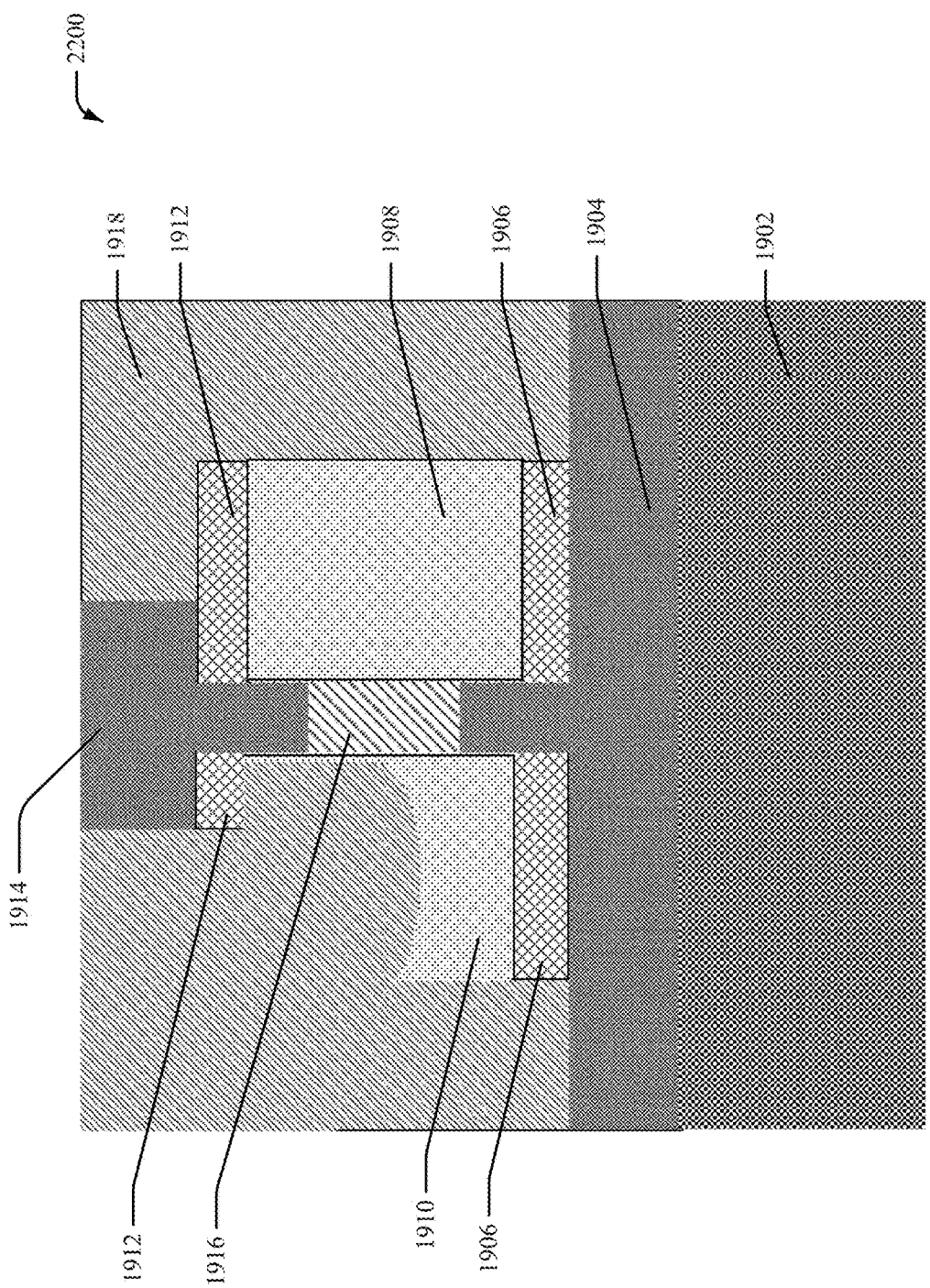
FIG. 18 illustrates a cross-sectional view of yet another example, non-limiting VFET structure in accordance with one or more embodiments described herein.

With reference to FIG. 18, presented is a cross-sectional view of a WET structure 2200 in accordance with one or more embodiments described herein. Repetitive description of like elements employed in other embodiments described herein is omitted for sake of brevity.

The VFET structure 2200 can include the substrate 1902, the source 1904, the bottom spacer 1906, the front gate 1908, the back gate 1910, the top spacer 1912, the drain 1914, the channel 1916, and the dielectric 1918. In an embodiment, the mask layer 2002 can be stripped from the intermediate VFET structure 2100 to form the VFET structure 2200. In another embodiment, additional dielectric material of the dielectric 1918 can be deposited over an entire structure after removal of the mask layer 2002. In an aspect, a CMP process can be applied after deposition of additional dielectric material of the dielectric 1918 to create the VFET structure 2200 as shown in FIG. 18. In an aspect, the back gate 1910 of the VFET structure 2200 can comprise a first length that is different than a second length of the front gate 1908 of the VFET structure 2200. For example, the first length of the back gate 1910 of the WET structure 2200 can be smaller than (e.g., less than) the second length of the front gate 1908 of the VFET structure 2200. In a non-limiting example, a length of the back gate 1910 of the VFET structure 2200 can be 5 nm and a length of the front gate 1908 of the VFET structure 2200 can be 15 nm. The intermediate VFET structure 1900 can be, for example, a VFET with back bias capability and/or improved parasitic capacitance (e.g., reduced parasitic capacitance as compared to conventional transistor structures). The back gate 1910 of the intermediate VFET structure 1900 can be placed on a bottom source side of the intermediate VFET structure 1900. In an embodiment, the back gate 1910 can modulate a barrier height at a source/gate junction of the intermediate WET structure 1900 to, for example, module a threshold voltage of the VFET structure 1900. In another embodiment, a bias for the back gate 1910 can be different than a bias for the front gate 1008. For example, the back gate 1910 and the front gate 1008 can be separated without being electrically connected.

Figure 19:
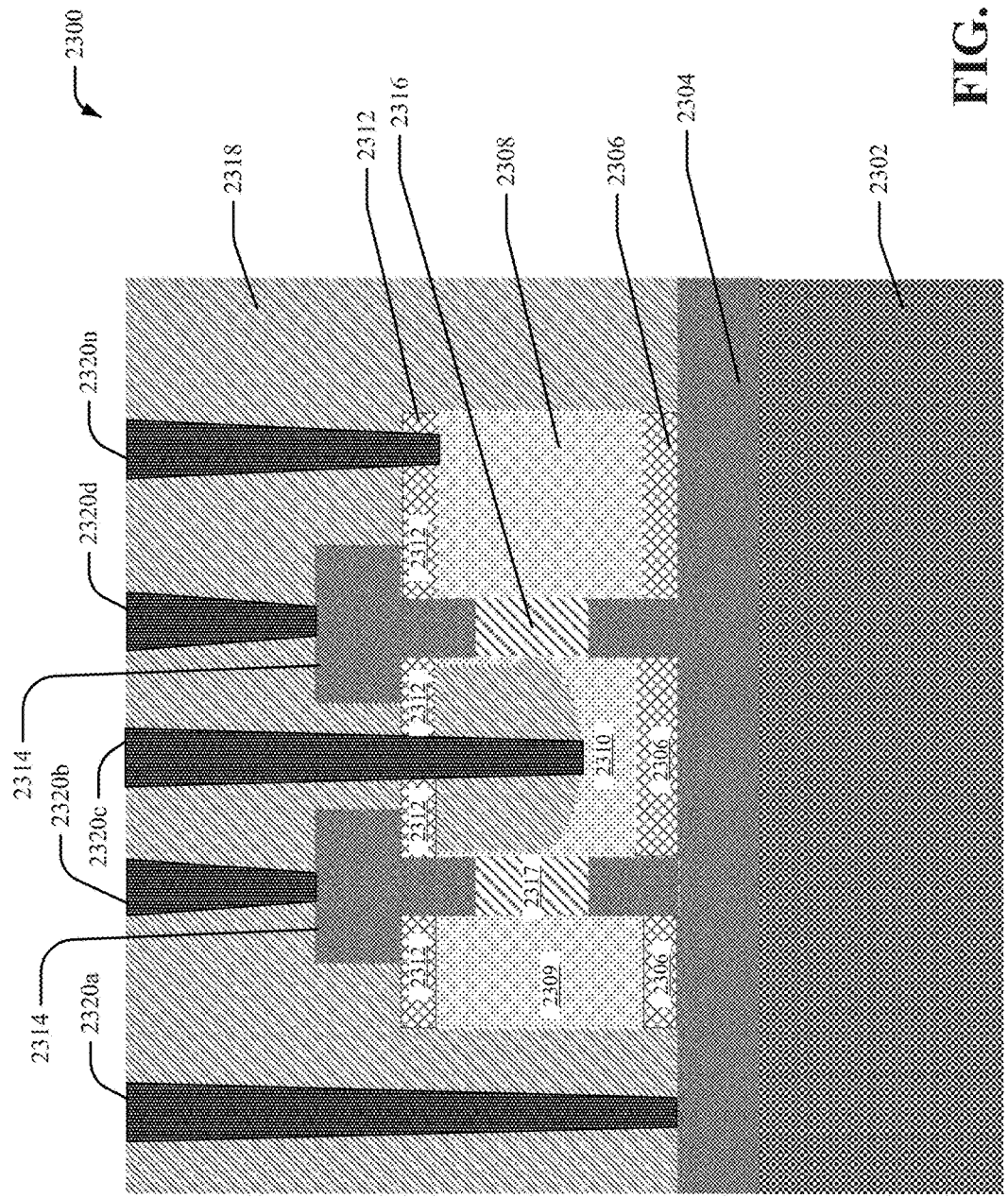
FIG. 19 illustrates a cross-sectional view of yet another example, non-limiting VFET structure in accordance with one or more embodiments described herein.

With reference to FIG. 19, presented is a cross-sectional view of a VFET structure 2300 in accordance with one or more embodiments described herein. Repetitive description of like elements employed in other embodiments described herein is omitted for sake of brevity.

The FET structure 2300 can include a source 2304 deposited on a substrate 2302. A bottom spacer 2306, a channel 2317 and/or a channel 2317 can be deposited on the source 2304. A back gate 2310 can be deposited on the bottom spacer 2306. Furthermore, a front gate 2308 and/or a front gate 2309 can be deposited on the bottom spacer 2306. In an embodiment, the channel 2316 can separate the back gate 2310 from the front gate 2308. Additionally, the channel 2317 can separate the back gate 2310 from the front gate 2309. A top spacer 2312 can be deposited on the front gate 2308, the front gate 2309 and/or the back gate 2310. A drain 2314 can be deposited on the channel 2316 and/or the top spacer 2312. Furthermore, the drain 2314 can be deposited on the channel 2317 and/or the top spacer 2312. In an embodiment, an dielectric 2318 can also be deposited on the substrate 2302, the top spacer 2312 and/or the back gate 2310. For example, the dielectric 2318 can be an interlayer dielectric that is coated on the substrate 2302, the top spacer 2312 and/or the back gate 2310. In an aspect, the back gate 2310 can comprise a first length that is different than a second length of the front gate 2308 and/or the front gate 2309. For example, the first length of the back gate 2310 can be smaller than (e.g., less than) the second length of the front gate 2308 and/or the front gate 2309. Alternatively, the first length of the back gate 2310 can be larger than the second length of the front gate 2308 and/or the front gate 2309. In a non-limiting example, a length of the back gate 2310 can be 5 nm and a length of the front gate 2308 and/or the front gate 2309 can be 15 nm. The FET structure 2300 can be, for example, a VFET with back bias capability and/or improved parasitic capacitance (e.g., reduced parasitic capacitance as compared to conventional transistor structures). The back gate 2310 of the FET structure 2300 can be placed on a bottom source side of the FET structure 2300. In an embodiment, the back gate 2310 can modulate a barrier height at a source/gate junction of the FET structure 2300 to, for example, module a threshold voltage of the FET structure 2300. In another embodiment, a bias for the back gate 2310 can be different than a bias for the front gate 2308. For example, the back gate 2310 and the front gate 2308 can be separated without being electrically connected. In yet another embodiment, the FET structure 2300 can include a set of contacts 2320*a*-*n*. For instance, the contact 2320*a* can be electrically coupled to the source 2304, the contact 2320*b* can be electrically coupled to the drain 2314, the contact 2320*c* can be electrically coupled to the back gate 2310, the contact 2320*d* can be electrically coupled to the drain 2314, and the contact 2320*n* can be electrically coupled to the front gate 2308. The set of contacts 2320*a*-*n* can be a set of electrically conductive metal contacts. In an aspect, the contact 2320*b* can be electrically coupled to the contact 2320*d*. For example, the contact 2320*b* and the contact 2320*d* can be implemented as a single contact.

Figure 20:
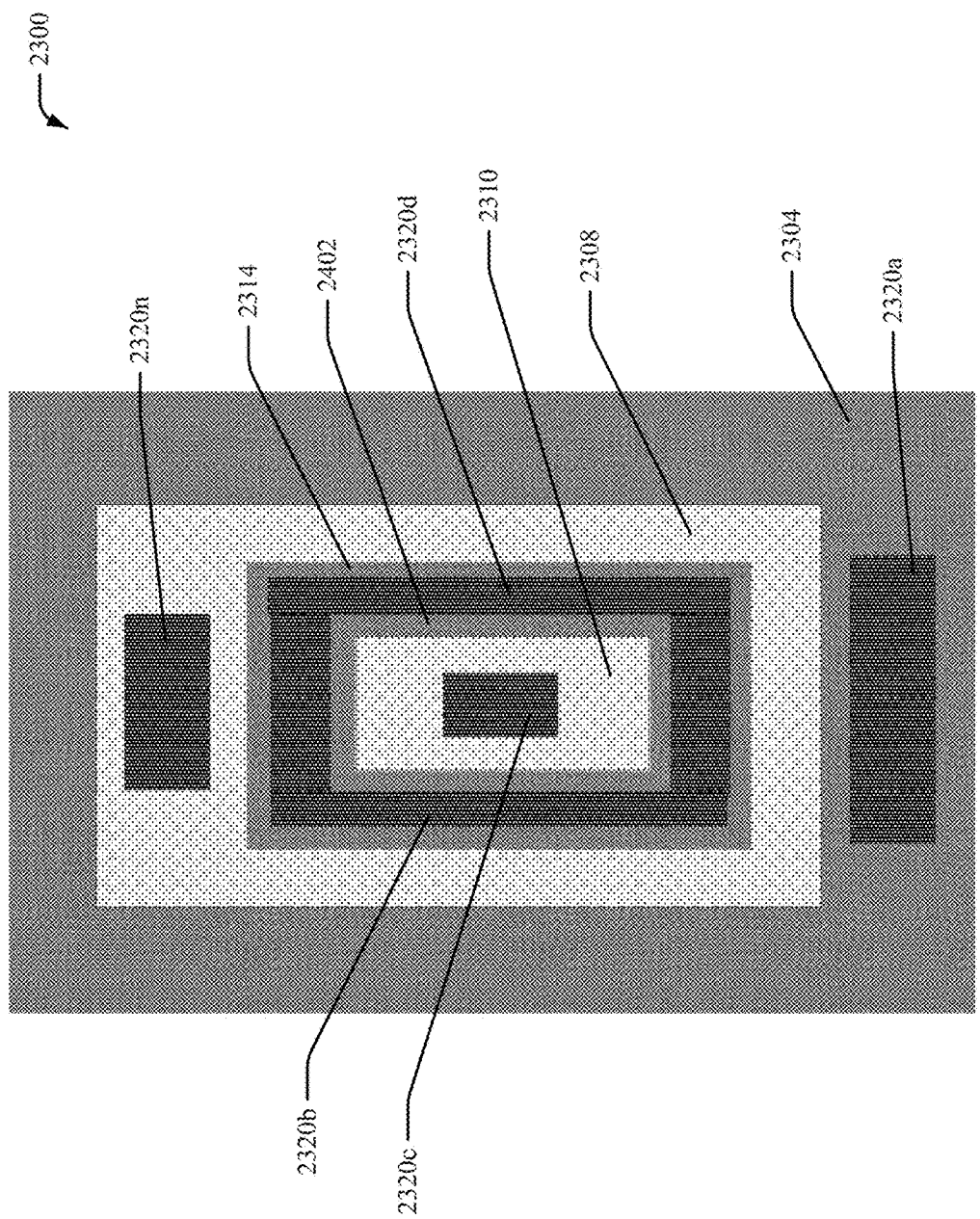
FIG. 20 illustrates a top view of yet an example, non-limiting VFET structure in accordance with one or more embodiments described herein.

With reference to FIG. 20, presented is a top view of a VFET structure 2300 in accordance with one or more embodiments described herein. Repetitive description of like elements employed in other embodiments described herein is omitted for sake of brevity.

The FET structure 2300 shown in FIG. 20 includes the set of contacts 2320*a*-*n*. For instance, the contact 2320*a* can be electrically coupled to the source 2304, the contact 2320*b* can be electrically coupled to the drain 2314, the contact 2320*c* can be electrically coupled to the back gate 2310, the contact 2320*d* can be electrically coupled to the drain 2314, and the contact 2320*n* can be electrically coupled to the front gate 2308. In an aspect, the contact 2320*b* can be electrically coupled to the contact 2320*d*. For example, the contact 2320*b* and the contact 2320*d* can be implemented as a single contact. In an embodiment, a drain portion 2402 of the FET structure 2300 can correspond to a fin structure for the FET structure 2300 where a height of the drain portion 2402 is higher than a height of the source 2304, the front gate 2308 and the back gate 2310.

Figure 21:
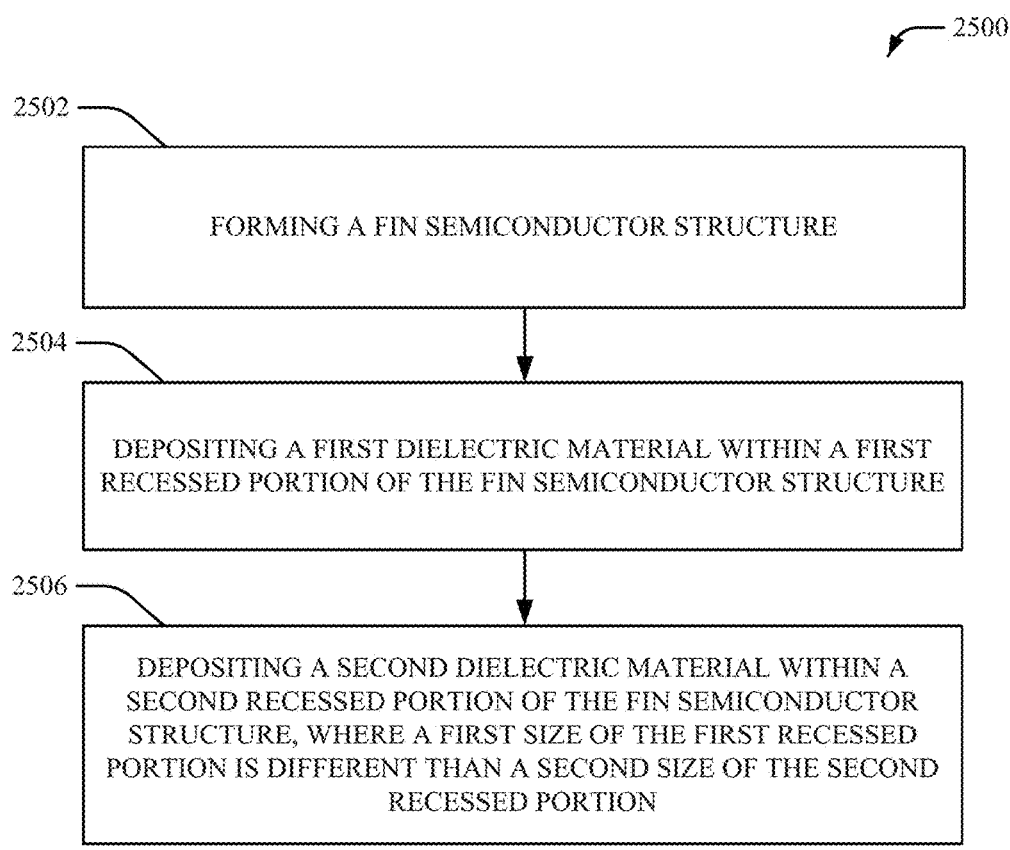
FIG. 21 illustrates a flow diagram of an example, non-limiting method that facilitates fabrication of an asymmetric dual gate fully depleted transistor in accordance with one or more embodiments described herein.

FIG. 21 illustrates a flow diagram of an example, non-limiting method 2500 that fabrication of an asymmetric dual gate fully depleted transistor in accordance with one or more embodiments described herein. Repetitive description of like elements employed in other embodiments described herein is omitted for sake of brevity.

At 2502, a fin semiconductor structure is formed. The fin semiconductor structure can be, for example, a semiconductor substrate. For example, the fin semiconductor structure can be a semiconductor fin structure shaped similar to a fin. Furthermore, the fin semiconductor structure can be associated with a set of semiconductor channels. In an embodiment, the fin semiconductor structure can be a body portion of a transistor device. In one example, the fin semiconductor structure can be a fin silicon structure. However, it is to be appreciated that the fin semiconductor structure can be formed from a different semiconductor material such as, for example, silicon germanium, germanium, III-V materials, II-VI materials, or another type of semiconductor material.

At 2504, a first dielectric material is deposited within a first recessed portion of the fin semiconductor structure. The first dielectric material can be, for example, an oxide, a nitride, an oxynitride, a carbon containing oxide/nitride, or another type of dielectric material.

At 2506, a second dielectric material is deposited within a second recessed portion of the fin semiconductor structure, where a first size of the first recessed portion is different than a second size of the second recessed portion. For example, a first size of the first recessed portion can be smaller than (e.g., less than) a second size of the second recessed portion. In one embodiment, the first recessed portion can be associated with a first gate structure (e.g., a back gate) and the second recessed portion can be associated with a second gate structure (e.g., a front gate). The second dielectric material can be, for example, an oxide, a nitride, an oxynitride, a carbon containing oxide/nitride, or another type of dielectric material.

In certain embodiments, the method 2500 can additionally or alternatively include etching the fin semiconductor structure to form the first recessed portion of the fin semiconductor structure. In certain embodiments, the method 2500 can additionally or alternatively include depositing a mask portion of the fin semiconductor structure. The mask portion can be, for example, an oxide, a nitride, an oxynitride, a carbon containing oxide/nitride, or another type of dielectric material. In certain embodiments, the method 2500 can additionally or alternatively include etching the mask portion of the fin semiconductor structure to form the first recessed portion of the fin semiconductor structure. In an embodiment, the etching the mask portion can include etching a portion of the fin semiconductor structure to form the first recessed portion of the fin semiconductor structure of the fin semiconductor structure. In certain embodiments, the method 2500 can additionally or alternatively performing a chemical mechanical planarization to form the first recessed portion.

For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies in accordance with the disclosed subject matter. In addition, those skilled in the art will understand and appreciate that the methodologies could alternatively be represented as a series of interrelated states via a state diagram or events. The flowchart and block diagrams in the Figures illustrate the architecture, functionality, and operation of possible implementations of systems, methods, apparatuses and devices according to various embodiments of the present invention. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "electronic device" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, an electronic device and/or a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, electronic devices and/or processors can exploit nano-scale architectures such as, but not limited to, molecular and quantum-dot based transistors, switches and gates, in order to optimize space usage or enhance performance of user equipment. An electronic device and/or a processor can also be implemented as a combination of computing processing units.

What has been described above include mere examples of systems and methods. It is, of course, not possible to describe every conceivable combination of components or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A transistor device, comprising:
   a semiconductor channel structure;
   a first gate structure that comprises a first length; and
   a second gate structure, wherein the first gate structure is associated with a first recessed portion and wherein the second gate structure is associated with a second recessed portion, and wherein a first size of the first recessed portion is different than a second size of the second recessed portion, wherein the second gate structure is aligned with a source of the transistor device.

2. The transistor device of claim 1, wherein the transistor device is a Fin Field Effect Transistor (FinFET).

3. The transistor device of claim 1, wherein the transistor device is a lateral nanosheet Field Effect Transistor with a suspended nanosheet channel.

4. The transistor device of claim 1, wherein the transistor device is a vertical transport Field Effect Transistor (FET) that provides current flow perpendicular to a substrate of the transistor device.

5. The transistor device of claim 1, wherein the first gate structure controls electrostatics of the transistor device and the second gate structure controls a state and an operation of the transistor device.

6. The transistor device of claim 1, wherein the first gate structure controls a state and an operation of the transistor device and the second gate structure modulates a threshold voltage at a source of the transistor device.

7. The transistor device of claim 1, wherein the first gate structure comprises a first electrical contact that is different than a second electrical contact of the second gate structure, and wherein the first gate structure and the second gate structure provide improved performance of the transistor device.

8. A method, comprising:
   forming a fin semiconductor structure;
   depositing a first dielectric material within a first recessed portion of the fin semiconductor structure; and
   depositing a second dielectric material within a second recessed portion of the fin semiconductor structure, wherein a first size of the first recessed portion is different than a second size of the second recessed portion.

9. The method of claim 8, further comprising:
etching the fin semiconductor structure to form the first recessed portion of the fin semiconductor structure.

10. The method of claim 8, further comprising:
depositing a mask portion of the fin semiconductor structure.

11. The method of claim 10, further comprising:
etching the mask portion of the fin semiconductor structure to form the first recessed portion of the fin semiconductor structure.

12. The method of claim 11, wherein the etching the mask portion comprises etching a portion of the fin semiconductor structure to form the first recessed portion of the fin semiconductor structure of the fin semiconductor structure.

13. The method of claim 8, further comprising:
performing a chemical mechanical planarization to form the first recessed portion.

14. A transistor device, comprising:
a semiconductor channel structure;
a first gate structure that comprises a first length; and
a second gate structure, wherein the second gate structure modulates a threshold voltage for the transistor device and the first gate structure controls a state and an operation of the transistor device, wherein the first gate structure is associated with a first recessed portion and wherein the second gate structure is associated with a second recessed portion, and wherein a first size of the first recessed portion is different than a second size of the second recessed portion.

15. The transistor device of claim 14, wherein the transistor device is a vertical transport Field Effect Transistor (FET) that provides current flow perpendicular to a substrate of the transistor device.

16. The transistor device of claim 14, wherein the semiconductor channel structure is located between the first gate structure and the second gate structure.

17. The transistor device of claim 1, wherein the first gate structure is a front gate for the transistor device and the second gate structure is a back gate for the transistor device.

* * * * *